(12) United States Patent
Ghanadan et al.

(10) Patent No.: US 6,294,956 B1
(45) Date of Patent: *Sep. 25, 2001

(54) SYSTEM AND METHOD FOR PRODUCING AMPLIFIED SIGNAL(S) OR VERSION(S) THEREOF

(75) Inventors: Reza Ghanadan, Berkeley Heights; Kyriaki Konstantinou, Madison; Norman Gerard Ziesse, Chester, all of NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/444,318

(22) Filed: Nov. 19, 1999

(51) Int. Cl.⁷ .................................................. H03F 3/68
(52) U.S. Cl. ..................... 330/124 R; 330/295; 330/306; 455/103; 333/138
(58) Field of Search ................................. 330/124 R, 295, 330/302, 306; 455/103; 333/139, 156, 166

(56) References Cited

U.S. PATENT DOCUMENTS

| | | | |
|---|---|---|---|
| 3,571,739 | * 3/1971 | Seidel ..................... | 330/4.5 |
| 4,791,390 | * 12/1988 | Harris et al. ............ | 333/166 |
| 5,163,181 | * 11/1992 | Koontz .................... | 455/103 |
| 5,175,878 | * 12/1992 | Davis et al. ............. | 455/103 |
| 5,206,604 | * 4/1993 | Vaninetti ................ | 330/124 R |
| 5,587,548 | * 12/1996 | Smith, III .............. | 84/659 |
| 5,896,061 | * 4/1999 | Behrent ................... | 329/308 |
| 5,929,938 | * 7/1999 | Cho ......................... | 348/665 |
| 6,006,113 | * 12/1999 | Meredith ................. | 455/562 |

OTHER PUBLICATIONS

Design Study on RF Stage for Miniature PHS Terminal, Aug. 1996.*

* cited by examiner

Primary Examiner—Robert Pascal
Assistant Examiner—Henry Choe
(74) Attorney, Agent, or Firm—Allen, Dyer, Doppelt, Milbrath & Gilchrist, P.A.

(57) ABSTRACT

A signal amplification system involves transforming at least one signal to be amplified into at least one transformed signal which is amplified and the resulting amplified transformed signal(s) can be used to produce a version(s) of the at least one original signal. The at least one transformed signal can be produced from the at least one original signal by using the at least one original signal to amplitude and/or angle (phase or frequency) modulate the at least one original signal. After amplification of the at least one transformed signal, the resulting at least one amplified transformed signal is de-modulated to produce a version(s) of the at least one signal. In transforming the at least one original signal to produce the at least one transformed signal, the at least one original signal is transformed into a more desirable form, such as a more power efficient form, for amplification. By amplifying the at least one transformed signal, more efficient and/or less costly amplifier(s) can be used to amplify the at least one signal in a linear fashion. Depending on the embodiment, at least one signal to be amplified can be transformed into at least one transformed signal by combining offset versions of the at least one original signal to produce the at least one transformed signal having the energy of the at least one signal spread in time and/or to produce the at least one transformed signal having a reduced peak to average power ratio(s)(PAR). Multiple signals to be amplified can be transformed into at least one transformed signal by combining the multiple signals, for example to produce the at least one transformed signal having a reduced peak to average power ratio(s) (PARs). After the at least one transformed signal is amplified, the resulting signal(s) can be de-modulated, inversely transformed, de-spread or reconstructed to recover a version(s) of the original signal(s).

28 Claims, 27 Drawing Sheets

*Time Flow Diagram:*

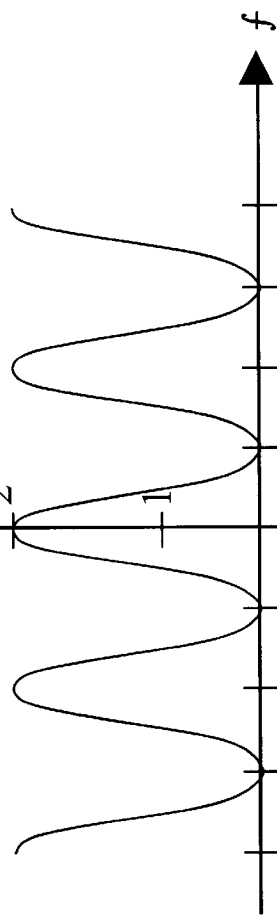
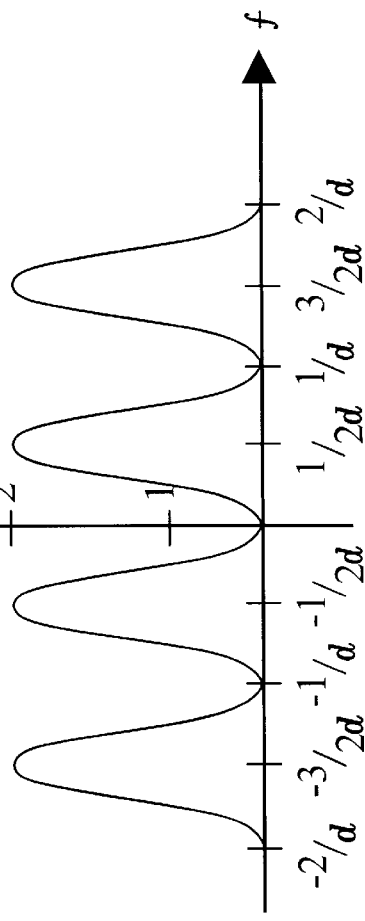
FIG. 9

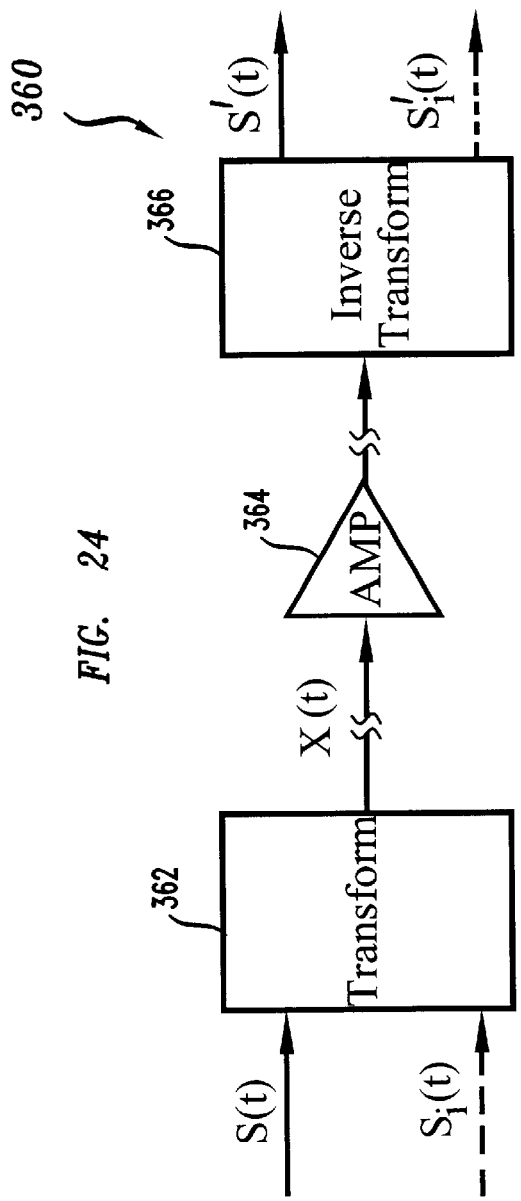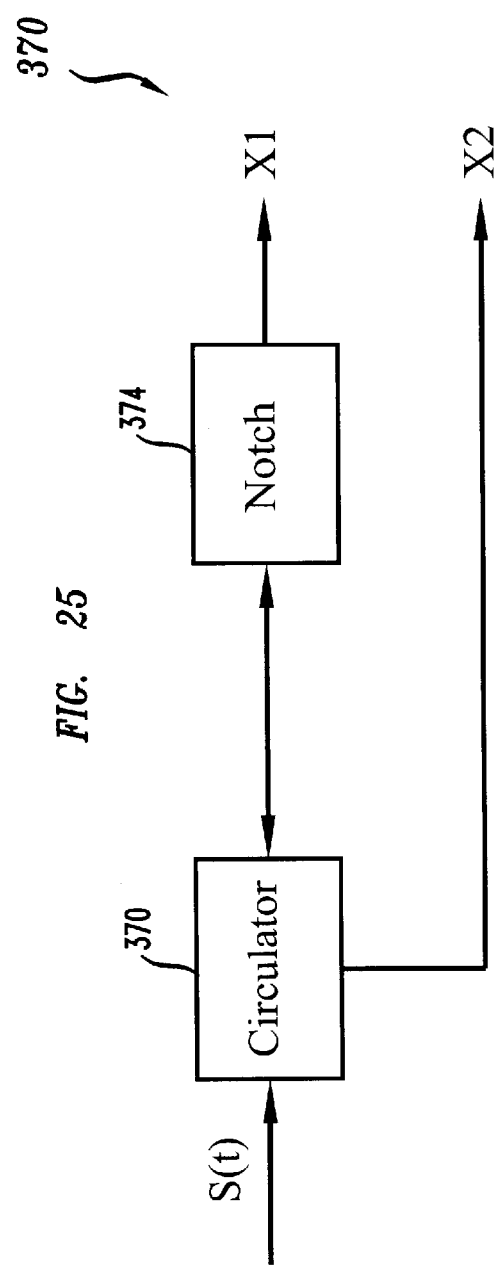

SYSTEM AND METHOD FOR PRODUCING AMPLIFIED SIGNAL(S) OR VERSION(S) THEREOF

BACKGROUND OF THE INVENTION

1. Field of the Invention

This invention relates to amplifying a signal and, more particularly, to a system and method which enables efficient and linear amplification of a signal.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, a power amplifier, however, has a transfer function with nonlinear and "linear" regions. Whether the power amplifier is operating in a linear or nonlinear region depends on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the amplifier is being overdriven, and the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, such as Global System for Mobile Communications (GSM) or North American TDMA, when multiple carrier signals are combined for amplification with a power amplifier, the resulting PAR is about 9–10 dB for a large number of carriers. In a code division multiple access (CDMA) system, a single loaded 1.25 Mhz wide carrier can typically have a PAR of 11.3 dB. For orthogonal frequency division multiplexing (OFDM), multicarrier signals can have a PAR of up to 20 dB. These signals have to be amplified fairly linearly to avoid generating ACP.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between cutoff and saturation. Class B amplifiers are biased near cutoff, resulting in a rectified drain current waveform. Class AB amplifiers are biased in between the bias points of classes A and B.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various linearization methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path. Pre-distortion techniques distort the input signal prior to amplification by taking into account the transfer function characteristics for the amplifier. As such, the desired amplified signal is achieved from the pre-distorted input signal. These techniques help to improve the efficiency of the amplifier while maintaining linearity, but to be able to handle the large peaks of a signal, the amplifiers still operate inefficiently. Other linearization techniques are possible. For example, baseband processing techniques, such as peak clipping, reduce the peak to average power ratio (PAR) of the signal but tend to degrade the signal. The amount of PAR reduction is limited by the amount of tolerable degradation. Another technique uses the input signal envelope to dynamically adjust the amplifier bias such that a high bias is only applied when a large peak is encountered.

Due to the potential for high peak powers, CDMA and TDMA base stations typically use radio frequency (RF) amplifiers operating in class AB mode and biased with a high current to be able to handle those peak powers. The efficiency of these amplifiers is typically less than 10%. This low efficiency leads to higher power consumption, lower overall reliability and higher operating temperatures. Accordingly, there is a need for a more efficient power amplifier architecture which can amplify signals having potentially high peak powers in a linear fashion.

SUMMARY OF THE INVENTION

The present invention involves transforming at least one signal to be amplified into at least one transformed signal which is amplified and the resulting amplified transformed signal(s) can be used to produce a version(s) of the at least one original signal. The at least one transformed signal can be produced from the at least one original signal by using the at least one original signal to amplitude and/or angle (phase or frequency) modulate the at least one original signal. After amplification of the at least one transformed signal, the resulting at least one amplified transformed signal is inversely transformed, de-spread or reconstructed to produce a version(s) of the at least one signal. In transforming the at least one original signal to produce the at least one transformed signal, the at least one original signal is transformed into a more desirable form, such as a more power efficient form, for amplification. By amplifying the at least one transformed signal, more efficient and/or less costly amplifier(s) can be used to amplify the at least one signal in a linear fashion. Depending on the embodiment, at least one signal to be amplified can be transformed into at least one transformed signal by combining offset versions of the at least one original signal to produce the at least one transformed signal having the energy of the at least one signal spread in time and/or to produce the at least one transformed signal having a reduced peak to average power ratio(s) (PAR). Multiple signals to be amplified can be transformed into at least one transformed signal by combining the multiple signals, for example to produce the at least one transformed signal having a reduced peak to average power ratio(s) (PARs). After the at least one transformed signal is amplified, the resulting signal(s) can be inversely transformed, de-spread or reconstructed to recover a version (s) of the original signal(s).

BRIEF DESCRIPTION OF THE DRAWINGS

Other aspects and advantages of the present invention may become apparent upon reading the following detailed description and upon reference to the drawings in which:

FIG. 9 shows the transfer function of a transformation according to the principles of the present invention;

FIG. 24 shows an embodiment of the amplification system producing a single transformed signal according to principles of the present invention;

FIG. 25 shows an implementation for a transformation according to principles of the present invention;

DETAILED DESCRIPTION

Figure 1:
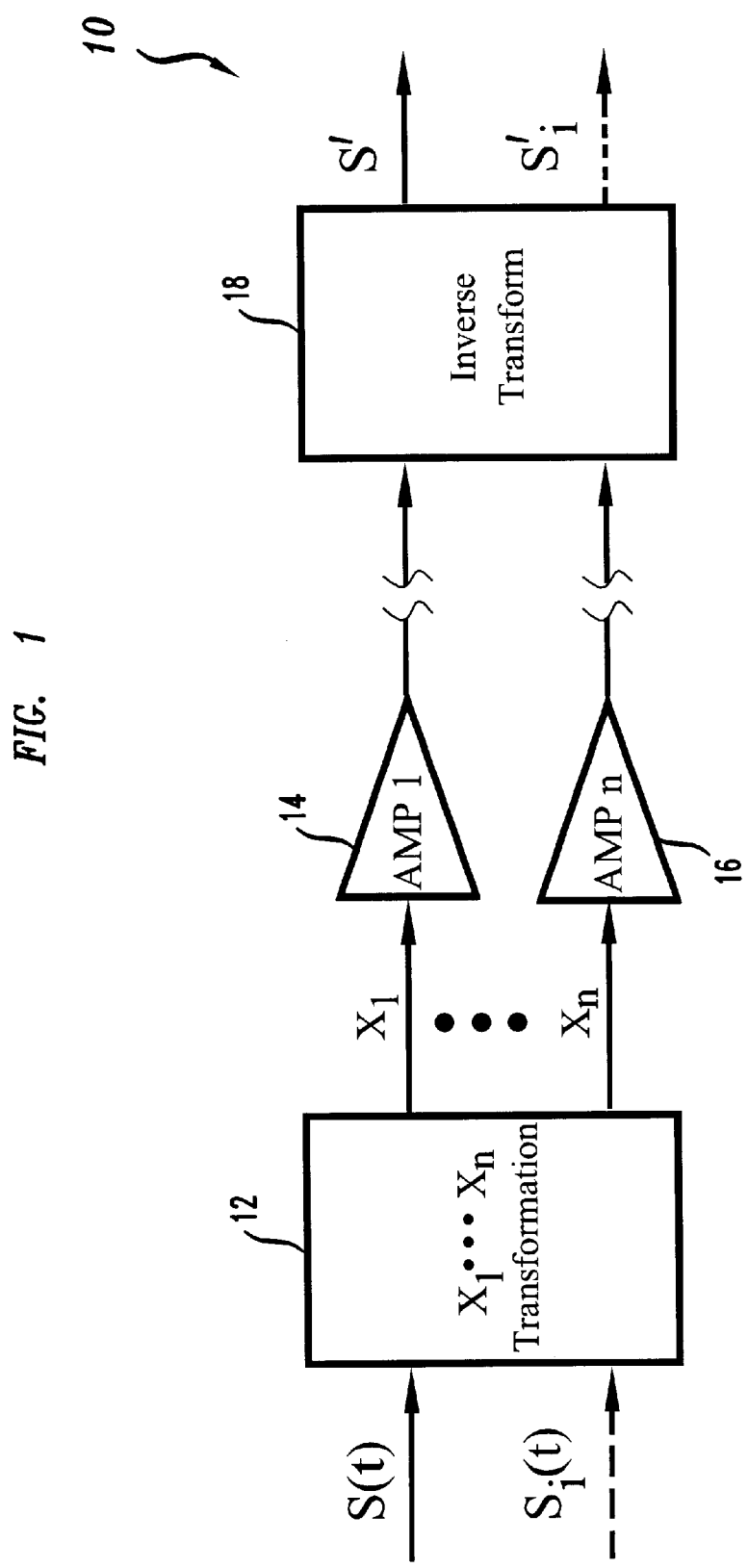
FIG. 1 shows an amplification system according to the principles of the present invention.

Illustrative embodiments of a power amplifier scheme according to the principles of the present invention are described below in which at least one signal to lo be amplified is transformed into an at least one transformed signal, having a more desirable form for amplification, using the at least one signal to amplitude and/or angle (phase and/or frequency) modulate the at least one signal. After amplification of the at least one transformed signal, the at least one amplified transformed signal can be inversely transformed to reconstruct a version(s) of the at least one original signal. FIG. 1 shows a general block diagram of an amplifier architecture 10 in which a transformation block 12 receives a signal S(t) (or signals Si(t)) to be amplified. The transformation block 12 transforms the signal S(t) (or signals Si(t)) into transformed signals X1 ... Xn which have a more power efficient form when compared to the original signal S(t) (or signals Si(t)). Depending on the embodiment, the transformation 12 can establish a relationship between the transformed signal(s) relative to the original signal(s) and/or between the transformed signals. As such the transformed signal(s) are correlated and can be combined with reduced loss to reconstruct a version(s) of the original signal(s). The transformed signal(s) can be produced in a more desirable form, such as a more power efficient form, using the signal(s) to be amplified to amplitude and/or angle (frequency and/or phase) modulate the signal(s) themselves. For example, the transformed signal(s) can be formed by combining versions of the original signal(s) having a relative offset, for example a relative time and/or phase shift, by converting amplitude information of the original signal(s) into angle information in the transformed signal(s), or by combining the different original signals, for example to produce transformed signal(s) having a reduced PAR(s).

By establishing a relationship or correlation between the original signal(s) and the transformed signal(s) and/or between the transformed signals, the transformed signal(s) can be amplified, and a version of the original signal can be reconstructed from the transformed signal(s) after amplification with relatively low loss. Moreover, in certain embodiments, the transformation 12 is an invertible function, transformation or operation which is performed on the original signal(s). As such, given the resulting signal(s), the original signal(s) can be recovered. After the amplification of the transformed signals by amplifiers 14 (AMP1) and 16 (AMPn), the resulting signal(s) are subjected to an inverse transformation, function or operation 18 to reconstruct a version(s) of the original signal(s). Portions of the inverse transformation 18 can be performed after amplification at a transmitter and/or at a receiver.

In an embodiment of FIG. 1 where n=2, the transformation block 12 can generate transformed signals X1=cos ($\omega$c t+$\phi$+$\theta$1)cos ($\omega$c t+$\phi$+$\theta$2) and X2=cos ($\omega$c t+$\phi$-$\theta$1)+cos ($\omega$c t+$\phi$-$\theta$2). In this example, $\phi$ contains the phase information of the original signal S(t), $\theta1=\tan^{-1}$ $$\left[\frac{V(t-d)}{V(t)}\right] + 1/2\cos^{-1}\left[\frac{V(t)^2 + V(t-d)^2}{2} - 1\right] \text{ and } \theta2 = \tan^{-1}\left[\frac{V(t-d)}{V(t)}\right] - 1/2\cos^{-1}\left[\frac{V(t)^2 + V(t-d)^2}{2} - 1\right]$$

where V(t) is the amplitude of the original signal S(t) which contains the amplitude information for the original signal S(t) and V(t-d) is the amplitude of a delayed or offset version of the original signal S(t-d). As such, the phase information of the original signal S(t) is retained in the transformed signals X1 and X2 and the amplitude information of the original signal S(t) is converted into amplitude and/or phase information in the transformed signals X1 and X2. The transformed signals have a reduced peak to average power because the original signal is combined with a version of the original signal, effectively spreading the energy of original signal over time while retaining the amplitude and phase information of the original signal in the transformed amplitude and phase information of the transformed signals.

Depending on the embodiment, the transformation 12 can produce the transformed signals X1 and X2 as constant envelope signals. For example, if n=2, the transformation 12 can be X1=cos ($\omega$c t+$\phi$+$\theta$) and X2=cos ($\omega$c t+$\phi$-$\theta$) where $\theta=\cos^{-1}$ (S(t)). As such the phase information of the original signal S(t) is retained in the transformed signals X1 and X2 and the amplitude information is converted into phase information in the transformed phase-modulated signals X1 and X2. The transformed signals have a reduced peak to average power (a constant envelope in this example) while retaining the amplitude and phase information of the original signal. Furthermore, depending on the embodiment, the transformation can occur at baseband, intermediate frequency (IF) and/or radio frequency (RF), and the inverse transformation can occur at RF prior to transmission or at a receiver. If the inverse transformation is to be performed at the receiver, the amplified transformed signals can be processed prior to transmission and inverse processing performed at the receiver.

In the time domain, the transformation of the original signal into transformed signals produces a spreading of the energy of the original signal in time, for example by combining or averaging offset versions of the original signal in time. In the frequency domain, spectral analysis of energy spreading of transformed signal(s) in time show that spectral shaping of the original signal can be performed to transform the original signal into a more power efficient form. For example, the transformed signals can be produced by reducing adjacent portions of the frequency spectrum of the original signal. With regard to implementation, cost and power loss reduction as well as engineering design, systems using any combination of filters, couplers, combiners can be used to transform a signal for amplification. Examples using delay line, delay filter (bandpass), comb filter, digital filter (finite impulse response (FIR/comb)) are described for transforming signal(s)(for example, multi-tone, gaussian, QPSK). Inverse shaping is applied after amplification, either prior to transmission or at the receiver, to reconstruct the original information signal. In embodiments where an amplified version of the original signal is reconstructed prior to transmission, various combinations of couplers (e.g., hybrid, directional, multiport, and/or circulators), delay elements and/or filters (e.g. bandpass, multirate filter banks) can be used to reduce the power loss at high power after signal amplification. The combination of elements is selected to perform an inverse transformation on the amplified transformed signal to reconstruct the original signal by redirecting the power (signals or portions of signals) that would otherwise be lost due to spectral shaping necessary to transform the original signal.

Figure 2:
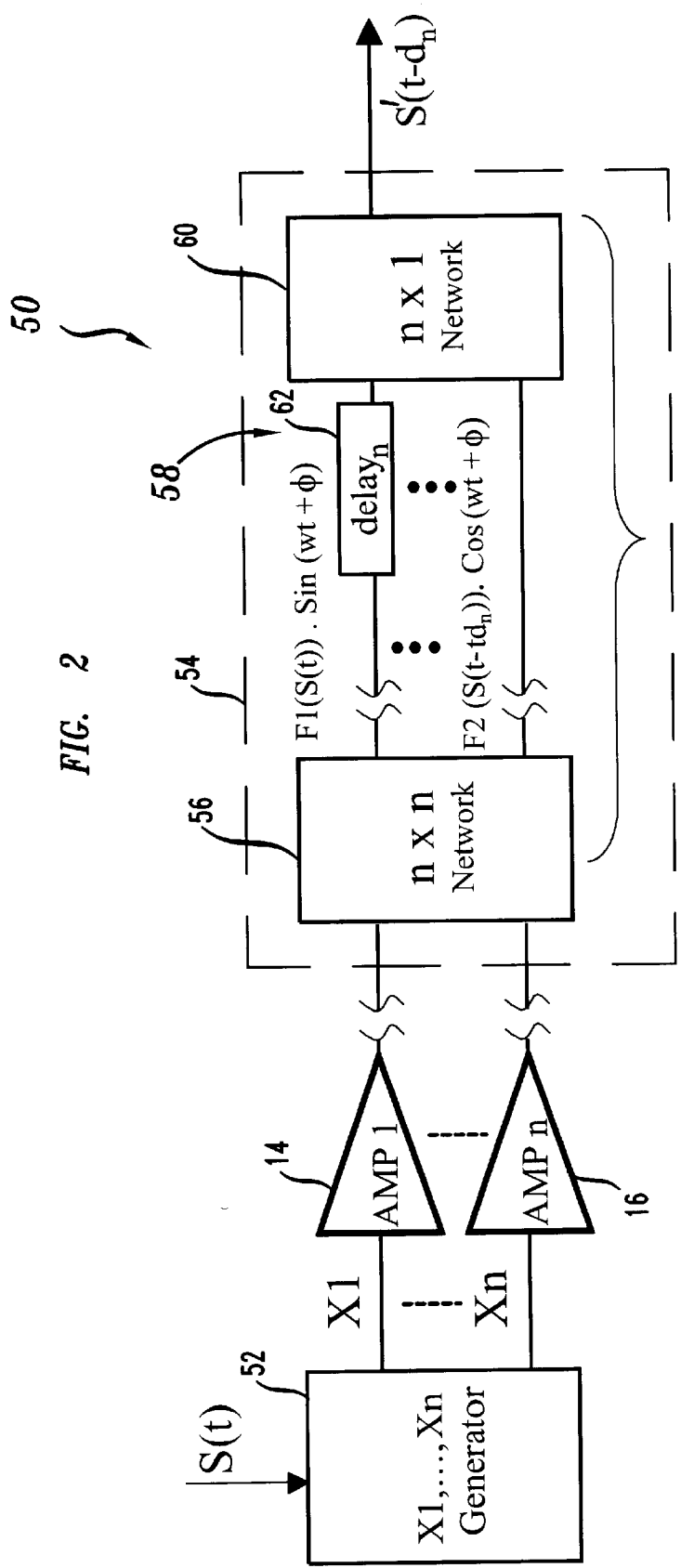
FIG. 2 shows an embodiment of the amplification system according to the principles of the present invention.

FIG. 2 shows an embodiment 50 of the signal amplification system 10 of FIG. 1 in which the original signal S(t) is transformed into transformed signals X1 to Xn. After the transformed signals X1 to Xn are amplified, the transformed signals X1 to Xn are combined to produce the original signal S(t) for transmission. In the amplification system 50, the original signal S(t) is transformed by block 52 into transformed signals X1 to Xn by averaging or combining time-delayed versions of the original signal S(t) to produce the transformed signals X1 to Xn for amplification by amplifiers AMP1 to AMPn, respectively, with a reduced PAR. The transformation 52 provides transformed signal(s)

$$X_j = K * \sum_{i=1}^{n} V(t-d_{ij})\cos(\omega_c t + \phi + \psi_{ij}) \text{ where } j = 1 \ldots n, \psi_{ij}$$

$\psi_{ij}$ is a phase shift introduced for power efficient combination or fine tuning the transformation and can be zero and $d_{ij}$ can be zero. In an embodiment where n=2, the original signal S(t)=V(t) cos($\omega$c t+$\phi$) where $\omega$c is the carrier frequency and 4 is the phase and V(t) is the envelope. The transformation 52 transforms the original signal S(t) to X1(t)=½[V(t)cos($\omega$c t+$\phi$)+V(t-d)sin($\omega$c t+$\phi$+$\psi$)] and X2(t)=½[V(t) cos($\omega$c t+$\phi$)-V(t-d)sin ($\omega$c t+$\phi$+$\psi$)]. Accordingly, the transformation 52 involves combining the original signal S(t) with its delayed replica. The PAR of X1 and X2 depends on the amount of delay d as well as the PAR of the original signal S(t). As such, the phase information of the original signal S(t) is retained in the transformed signals X1 and X2 and the amplitude information is converted into phase information and amplitude information in the transformed signals X1 and X2. The transformed signals X1 to Xn retain the amplitude and phase information of the original signal because the transformed signals X1 to Xn are produced from delayed versions of the original signal, and the transformed signals X1 to Xn are amplified with the same spectral content as the original signal S(t). After amplification at RF and at high power in this embodiment, the amplified transformed signals X1 to Xn are inversely transformed at block 54 to reconstruct a replica of the original signal S(t). Depending on the embodiment, the transformations of the original signal S(t) can be performed using time-delayed averaging, vector averaging, comb filtering, spectral shaping followed by for combining after amplification.

In this embodiment, the combiner 54 receives the transformed signals X1 to Xn, and an NXN network 56, such as a 90 degree or 180 degree hybrid coupler, phase shifts and combines the transformed signals to produce processed signals $S1=F1(S(t)) \sin(\omega t+\phi)$ and $Sn=Fn(S(t-d_n))\cos(\omega_c t+\phi)$ where $F1(S(t))=S(t)$ and $Fn(S(t-d_n))=S(t-d_n)$. The appropriate processed signals S1 to Sn are delayed by a delay arrangement 58 so that the processed signals S1 to Sn experience the same delay and can be combined by the N×1 network 60 to reconstruct a version S'(t−dn) of the original signal S(t). The amplified transformed signals are reconstructed in a manner which enables what can be termed as lossless combining to produce the version of the original signal. For example, the processed signal Sn which corresponds to a portion of the original signal S(t) delayed by an amount $d_n$ in the transformation 52 is not delayed while the processed signal S1 which corresponds to a portion of the original signal which was not delayed in the transformation 52 is delayed by delay 62 having a delay $d_n$.

Depending on the embodiment, the processed signals S1 to Sn have a relative delay(s) which are transmitted over separate antennas to provide delay and transmit diversity when receiving the original signal. In an example where n=2, the 2×2 network 56 phase shifts and combines the amplified transformed signals X1 and X2 to produce a first version S'(t) and a second delayed version S'(t−d) of the original signal S'(t) having a relative delay between them for transmission. As mentioned above, depending on the embodiment, the original signal can be transformed into more than two transformed signals with additional delays to produce a plurality of delayed versions $Si'(t-d_n)$ of the original signal for transmission and/or reconstruction of the original signal S(t). By transmitting a version of the original signal along with a delayed version(s) of the original signal, the system 50 can provide transmit and delay diversity to improve reception of the signal. At the receiver, a receiver can be configured to detect and receive the diverse versions of the original signal and take advantage of the diversity transmission. For example, the receiver could be a RAKE or multiple finger receiver or any other receiver which constructs the received signal from delayed versions of the transmitted signal. The versions S'(t) and S'(t−d) could be received on separate antennas, and the receiver performs the remainder of the inverse transformation used to convert the original signal S(t) to the transformed signals X1 and X2. As such, the receiver shifts and combines the first and second versions S'(t) and S'(t−d) to reconstruct a version S'(t−d) of the original signal. Alternative embodiments are possible.

Figure 3A:
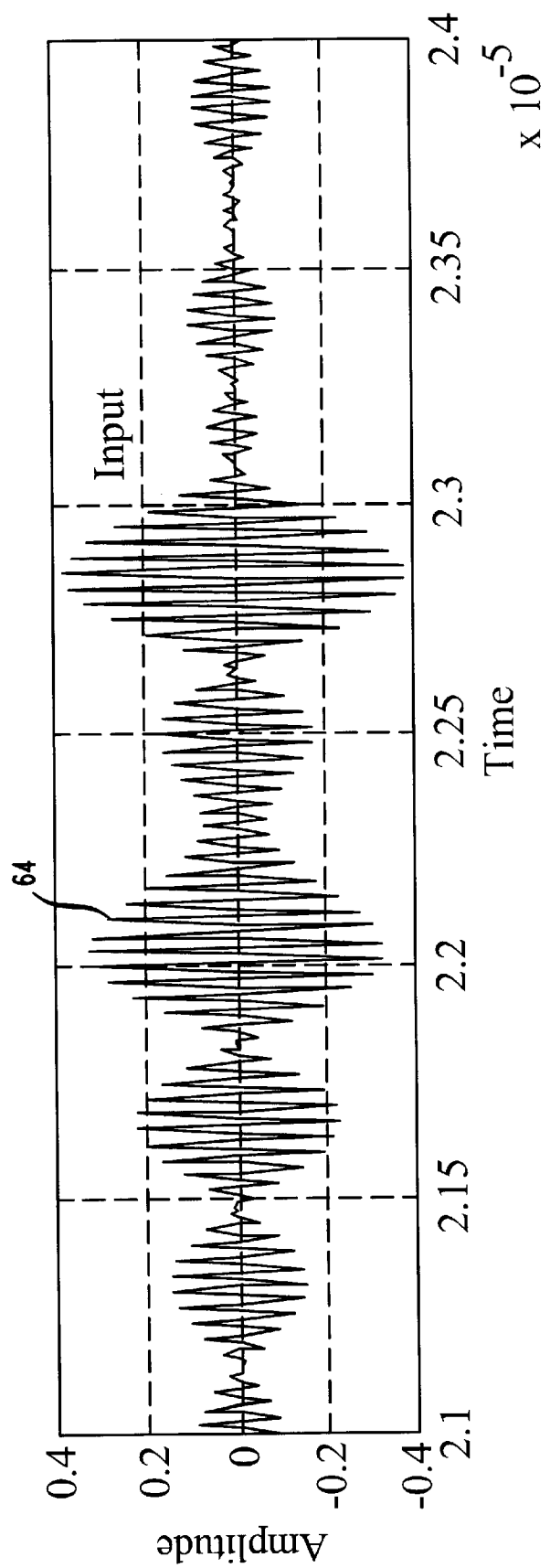
FIGS. 3A–C show a signal S(t) and the resulting transformed signals X1(t) and X2(t) according to a transformation according to the principles of the present invention.
Figure 3B:
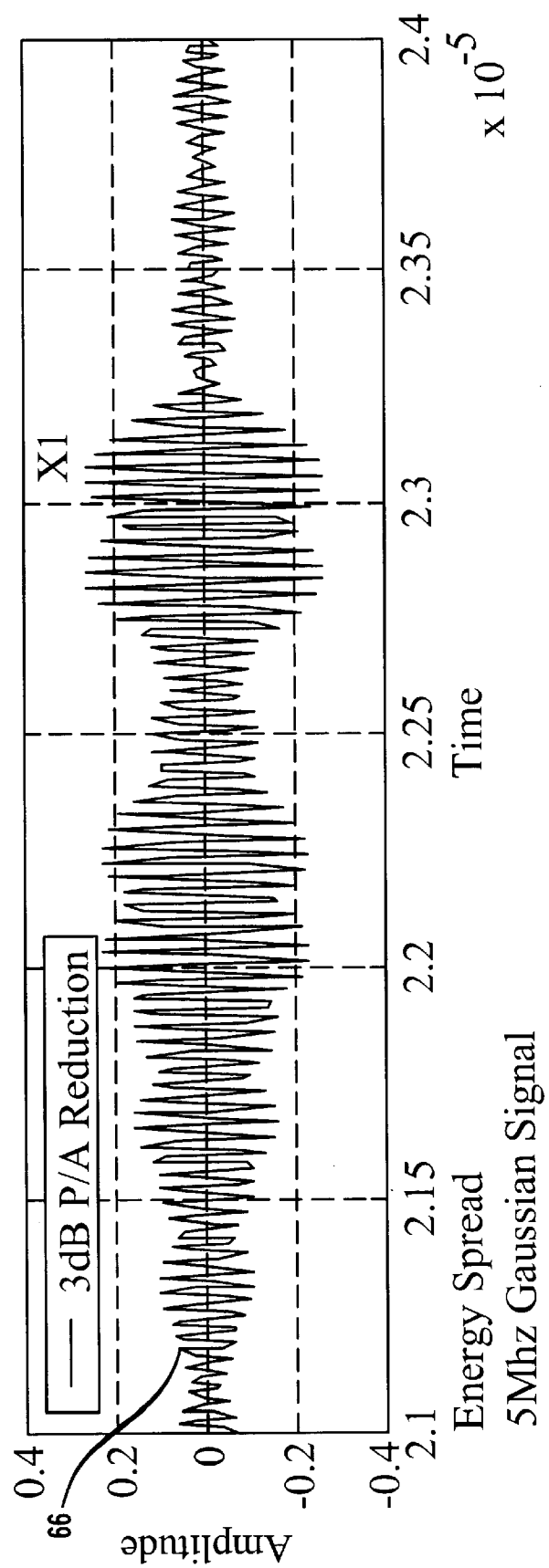
Figure 3C:
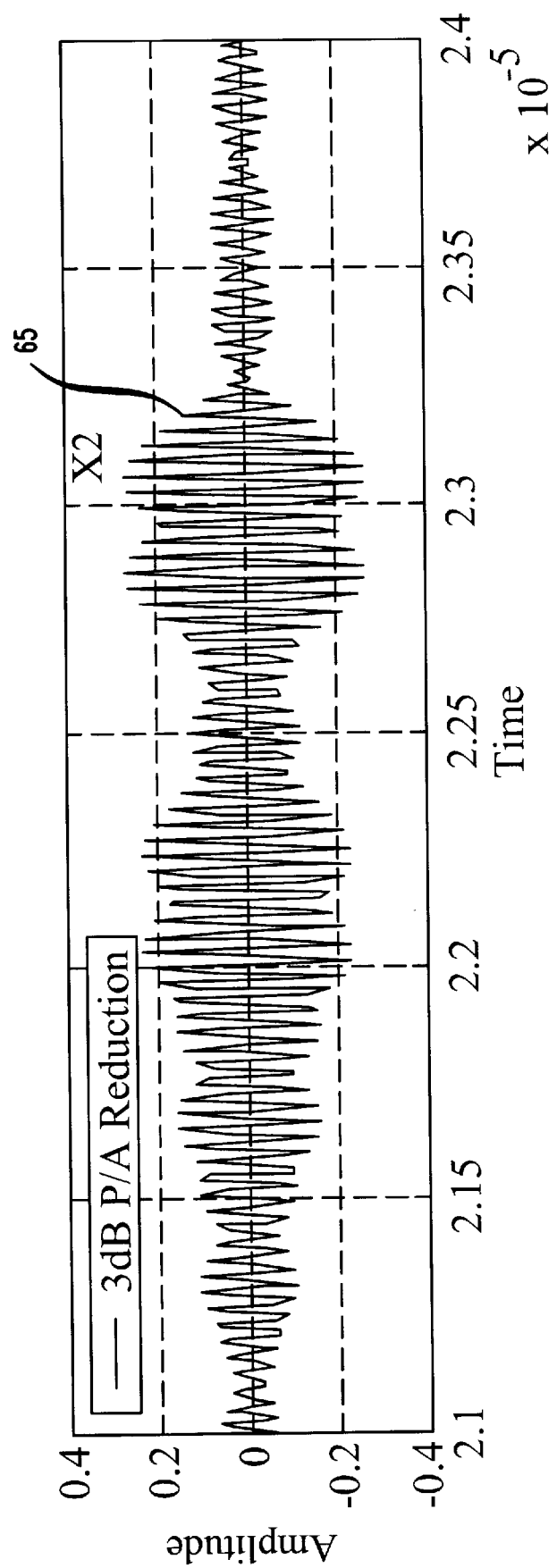
Figure 4:
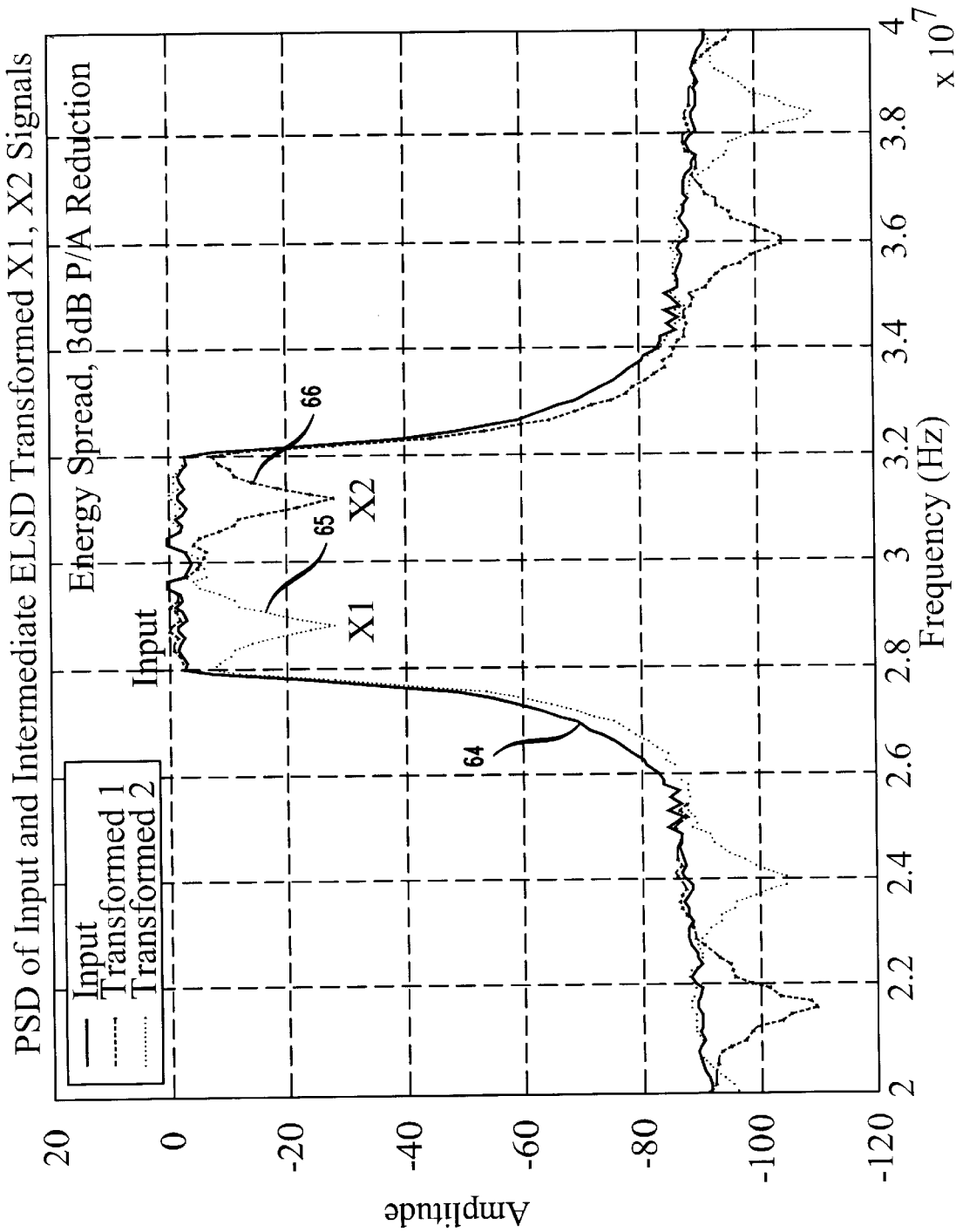
FIG. 4 shows a signal S(f) and the resulting transformed signals X1(f) and X2(f) in the frequency domain produced by a transformation according to the principles of the present invention.

FIG. 3A shows a signal 64 which is a 5 MHz gaussian signal to be amplified. The signal 64 is transformed to produce the transformed signal X1 (65) shown in FIG. 3B and the transformed signal X2(66) shown in FIG. 3C. The transformation of the signal 64 produces the transformed signals X1 and X2 with reduced peak to average power ratios when compared to the original signal. FIGS. 3A–3C show how the energy of the original signal is effectively spread over time in the transformed signals X1 and X2. Because there is a relationship established between the transformed signals and the original signal, an amplified version of the original signal can be reconstructed form the amplified transformed signals X1 and X2. FIG. 4 shows the signal 64 and the resulting transformed signals X1 (65) and X2(66) in the frequency domain. In the frequency domain, the transformation symmetrically reduces the energy in adjacent portions of the spectrum of the original signal. Since the transformed signals are produced from versions of the original signal relative to each other, there is a correlation between the transformed signals and the original signal, enabling the reconstruction of the original signal from the transformed signals X1 and X2. In this embodiment, the versions of the original signal are delayed or offset versions of the original signal and/or versions of the original signal with a spectrum that is selectively shaped. The versions of the original signal are shifted and combined relative to each other to produce transformed signals which are thereby correlated.

Simulations for an embodiment where n=2 show between 3 dB reduction of the PAR. In this example, the N×N network 56 is a 4 port network, for example a Magic T or Rat Race hybrid coupler (180 degrees) with a scattering coefficient matrix of:

$$S = \frac{1}{\sqrt{2}} \begin{bmatrix} & & 1 & 1 \\ & 0 & & \\ & & -1 & 1 \\ 1 & -1 & & \\ & & 0 & \\ 1 & 1 & & \end{bmatrix}.$$

The N×1 network 60 is a combiner with a coupling factor proportional to the ratio of the two inputs taking delay 62 loss into factor. There is very little loss in the networks 56 and 60.

Figure 5:
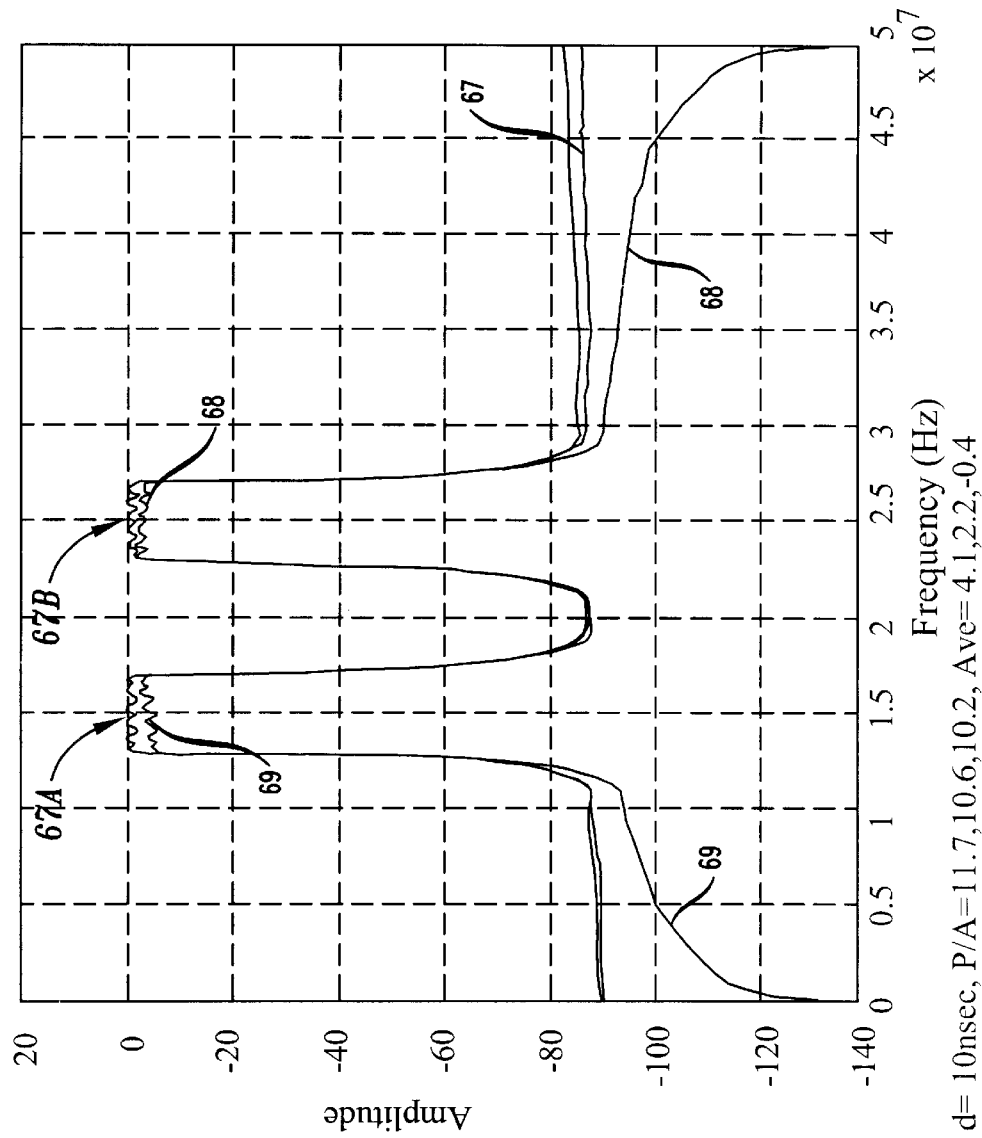
FIG. 5 shows a two carrier signal S(f) and the resulting transformed signals X1(f) and X2(f) in the frequency domain according to a transformation according to the principles of the present invention.

FIG. 5 shows the power spectrum distribution (PSD) of a signal 67 with two carriers 67A and 67B along with the transformed signals X1(68) and X2(69). As described above, the transformed signals X1 and X2 are produced by combining versions of the original signal which are offset by a delay. In the frequency domain, the transformed signal X1 is produced by reducing the amplitude of the carrier 67B, and the transformed signal X2 is formed by reducing the amplitude of the carrier 67A. In this embodiment, the PAR of the signal 67 is 11.7, and the transformed signals X1 and X2 are produced with respective PARs of 10.2 and 10.6 using a delay of 10 nsec.

Figure 6:
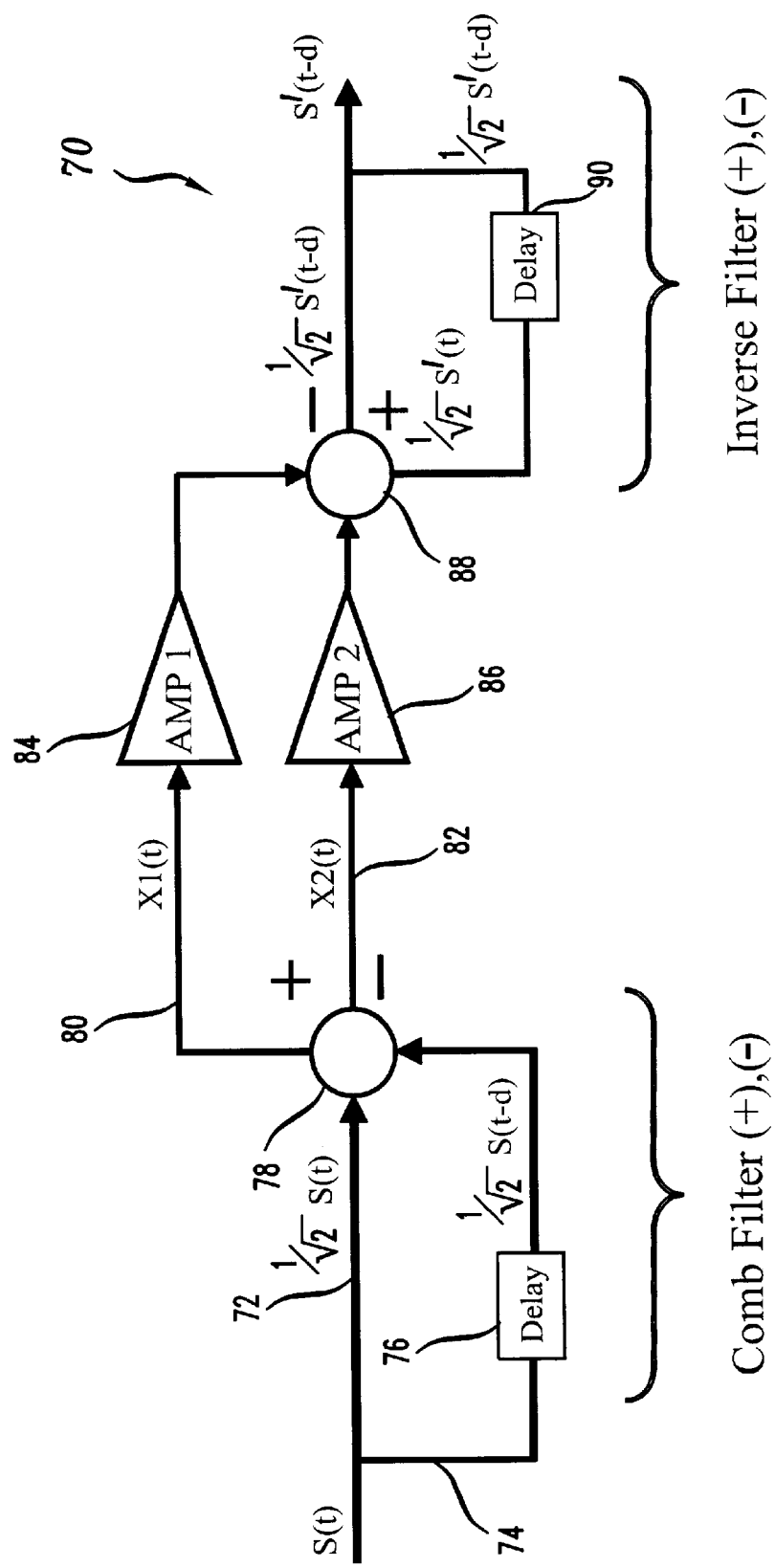
FIG. 6 shows a time-flow diagram of an embodiment of the amplification system according to the principles of the present invention.

FIG. 6 shows a time flow diagram of an embodiment 70 of the signal amplification system 50 of FIG. 2 where n=2. In this embodiment, the signal S(t) is split to provide a first version $1/\sqrt{2}*S(t)$ of the signal S(t) onto a first path 72 and a second version $1/\sqrt{2}*S(t)$ on a second path 74. On the second path 74, a delay 76 delays the signal S(t) in time by an amount d, thereby shifting the envelope of signal S(t). As such, the delay 76 produces a time-delayed version of the signal S(t) or $1/\sqrt{2}*S(t-d)$. The delay element 76 can be a delay line (for example, a low loss 50 nanosecond delay with less than 1 dB loss), a bandpass filter with constant group delay (for example, a 200 nanosecond delay for a frequency band between 2.10 to 2.17 GHz). In certain embodiments, the filter should have a linear phase response (the phase change introduced by the filter is linear over a frequency range) to cause no distortion. Depending on the signal S(t)

and the modulation type, such as quadrature phase shift keying (QPSK), other forms of delay elements or filters with desired characteristics are possible.

A combiner 78 combines the first version of the original signal S(t) and the second time-delayed version of the original signal S(t) to produce a first transformed signal X1(t) to a first amplifier path 80 and a second transformed signal X2(t) on a second amplifier path 82. In this embodiment, the combiner 78 combines the first version $1/\sqrt{2}*S(t)$ and the second time-delayed version $1/\sqrt{2}*S(t-d)$ to produce a first transformed signal X1(t)=½(S(t)+S(t−d)) on a first port (+) to the first amplifier path 80 and a second transformed signal X2(t)=½(S(t)−S(t−d)) on a second port (−) to a second amplifier path 82. As such, because the transformed signals are an average of the original signal with a time delayed version of the original signal, the PARs of the first and second transformed signals X1(t) and X2(t) are reduced when compared to the PAR of the original signal S(t). Additionally, the transformed signals X1(t) and X2(t) retain amplitude and phase information of the original signal S(t). The transformation or portions thereof can be implemented in the digital domain, intermediate frequency (IF) or RF. If the original signal is at RF, a splitter can be used to provide first and second versions of the original signal S(t) on the first and second paths 72 and 74. If the original signal is in the digital domain, the first and second versions of the original signal S(t) can be generated using a digital comb filter or finite impulse response filter from the original signal and subsequently up-converted to RF prior to amplification.

The transformed signal X1(t) on the first amplifier path 80 is amplified by an amplifier 84 (AMP1), and the second transformed signal X2(t) on the second amplifier path 82 is amplified by an amplifier 86 (AMP2). Because the transformed signals have a lower peak to average power ratio than the original signal S(t), the amplifiers 84 and 86 can be more power efficient and less costly while maintaining linear performance. The amplified transformed signals are inversely transformed to produce an amplified version of the original signal S. In this embodiment, the amplified transformed signals X1(t) and X2(t) are received by an inverse combiner 88 which combines the amplified signals X1(t) and X2(t) in a manner to produce a first amplified version $1/\sqrt{2}*S'(t)$ of the original signal S(t) on a first port (+) of the inverse combiner 88 and a amplified delayed version $1/\sqrt{2}*S'(t-d)$ of the original signal S(t) on a second port (−) of the inverse combiner 88.

A delay 90 delays the first amplified version $1/\sqrt{2}*S'(t)$ of the original signal from the first port (+) by a delay corresponding to the delay of the delay 76 which produced the delayed version $1/\sqrt{2}*S(t-d)$ of the original signal. Accordingly, the delay 90 produces a second amplified delayed version $1/\sqrt{2}*S'(t-d)$ of the original signal. The two amplified delayed versions of the original signal are combined to recontruct a delayed version of the original signal S'(t−d).

Figure 7:
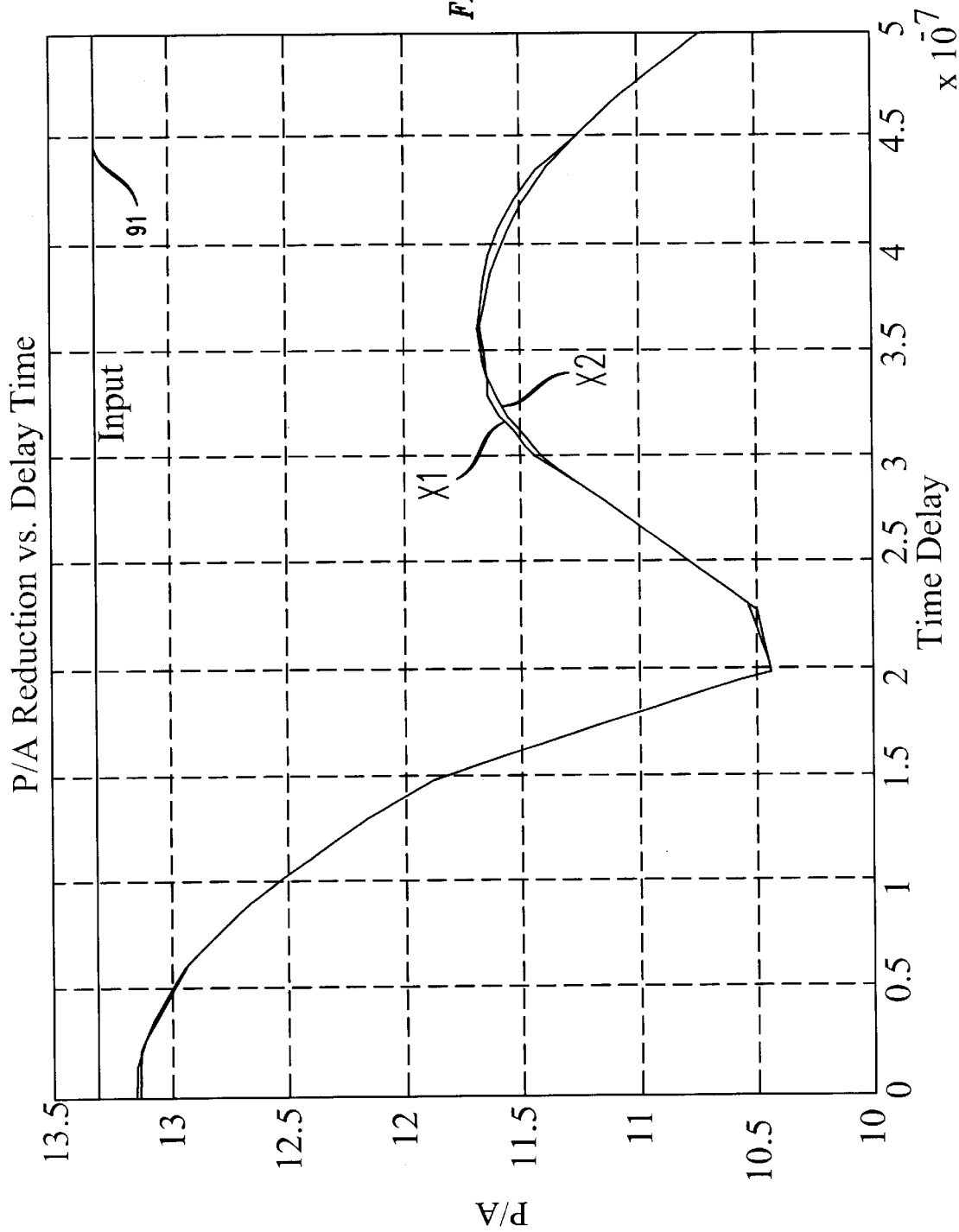
FIG. 7 shows the PAR reduction versus delay time using a transformation according to the principles of the present invention.
Figure 8:
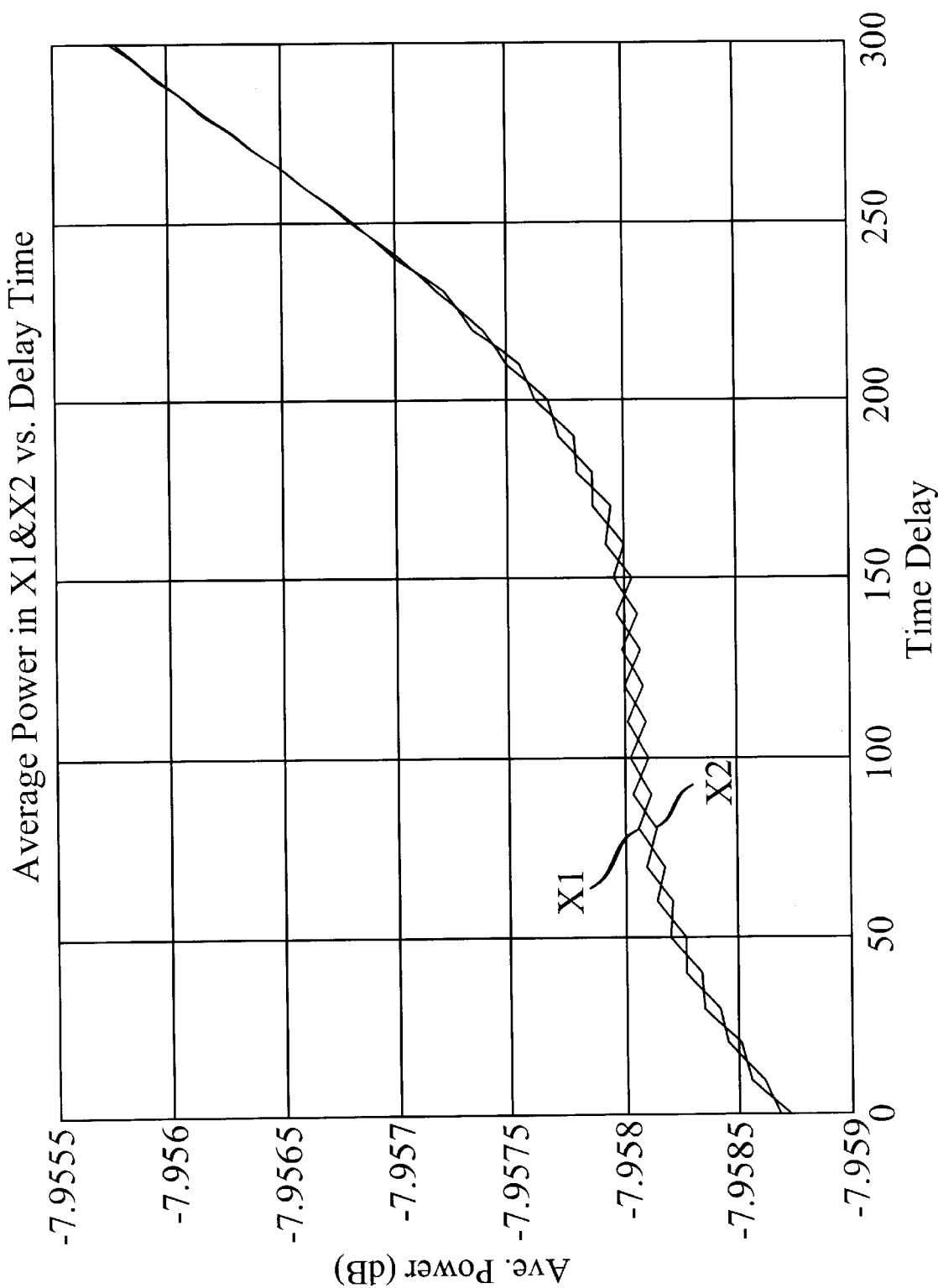
FIG. 8 shows the average power of the transformed signals X1 and X2 vs. delay time using a transformation according to the principles of the present invention.

Combining versions of the original signal offset in time by a delay to produce the transformed signals spreads the energy of the original signal in time. The amount of delay can be determined for best overall performance gain measured by power amplifier efficiency (output power over DC power consumed), linearity gain (for example, measured by examining ACP), or reduction in the PAR of transformed signal(s) vs. the original signal(s). FIG. 7 shows the reduction of the PARs of the transformed signals X1 and X2 relative to the PAR of a 5 MHz gaussian signal S (91). FIG. 8 shows the average power of the transformed signals X1 and X2 vs. time delay. The amount of delay can be determined and set, periodically determined and changed, determined and changed depending on certain performance thresholds or dynamically determined and changed.

Spectral analysis of energy spreading of transformed signal(s) shows selective shaping of the frequency spectrum of the original signal. Frequency (spectral) shaping to transform signals according to the principles of the present invention can be performed where by shaping the frequency characteristics of a signal, the signal can be transformed to a more power efficient form. Inverse shaping is applied after amplification, either prior to transmission or at the receiver, to reconstruct the original information signal In this embodiment, the transformation from the original signal S(t) to the transformed signals X1(t) and X2(t) is implemented using a comb filter with two ports (+) and (−). In the frequency domain, the first port (+) of the comb filter used to transform the original signal S(f) according to principles of the present invention can have a transfer function:

$$H^+(f)=1+\cos(2\pi fd)+j\sin(2\pi fd);$$

$$|H^+(f)|^2=4\cos^2(\pi fd);$$

Power Spectrum Density $(PSD)=S^+(f)=4\cos^2(\pi fd)S(f).$

The second port (−) of the comb filter can have a transfer function:

$$H^-(f)=1-\cos(2\pi fd)+j\sin(2\pi fd);$$

$$|H^-(f)|^2=4\sin^2(\pi fd);$$

$$PSD=S^-(f)=4\sin^2(\pi fd)S(f).$$

Accordingly, $$|H^+(f)|=2\cos(\pi fd);$$

$$H^+(f)=2\cos(\pi fd)e^{-j\pi fd}$$

$$|H^-(f)|=2\sin(\pi fd);$$

$$H^-(f)=2\sin(\pi fd)e^{-j\pi fd}.$$

The delay d can be determined by setting the average power in each branch or port (+) and (−) such that $\int PSD^+ = \int PSD^-$. Different portions of the frequency spectrum could be covered with H$^+$ or H$^-$ to reduce the PAR including covering different carriers or portions of the bands. For example, by covering different portions of the spectrum, via varying the delay, and by increasing the number of iterations or amplifiers, transformed signals having different PARs can be achieved.

FIG. 9 shows how the transformed signals could be represented by the outputs of the first and second ports (+) and (−) of the comb filter as a function of frequency as follows:

H$^+$(f)=2 cos($\pi$fd)e$^{-j\pi fd}$ when |f| is within the bandwidth (BW) and 0 otherwise, and H$^-$(f)=2 sin($\pi$fd)e$^{-j\pi fd}$ when |f| is within BW and ) otherwise.

Figure 10:
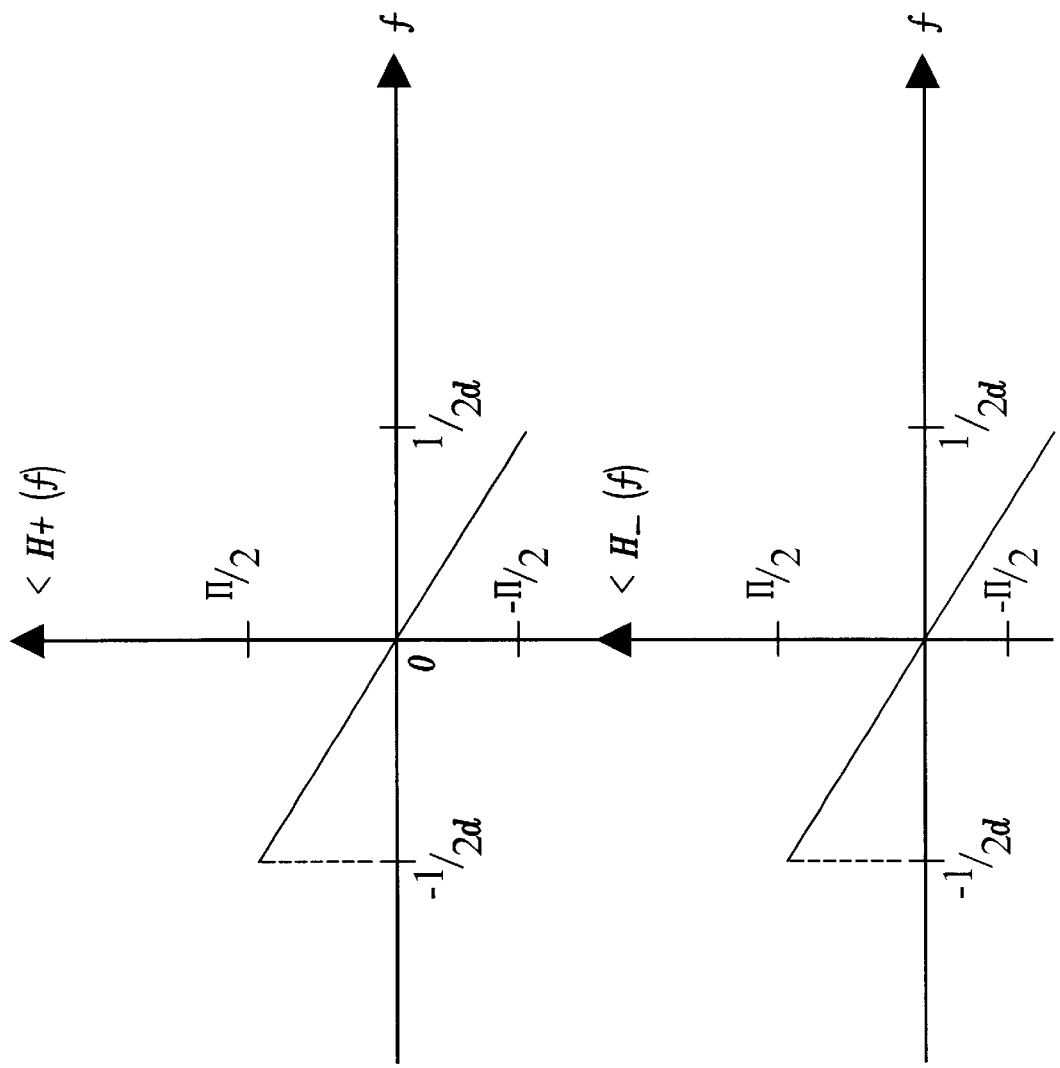
FIG. 10 shows the phase response of a transformation according to the principles of the present invention.

As such, FIG. 9 shows the periodic cos/sin amplitude characteristics of the example transformation in the frequency domain. FIG. 10 shows a plot of the linear phase response of the transformation. Other filters with such orthogonal characteristics can be used, such as multirate filtering for frequency decomposition.

Figure 11:
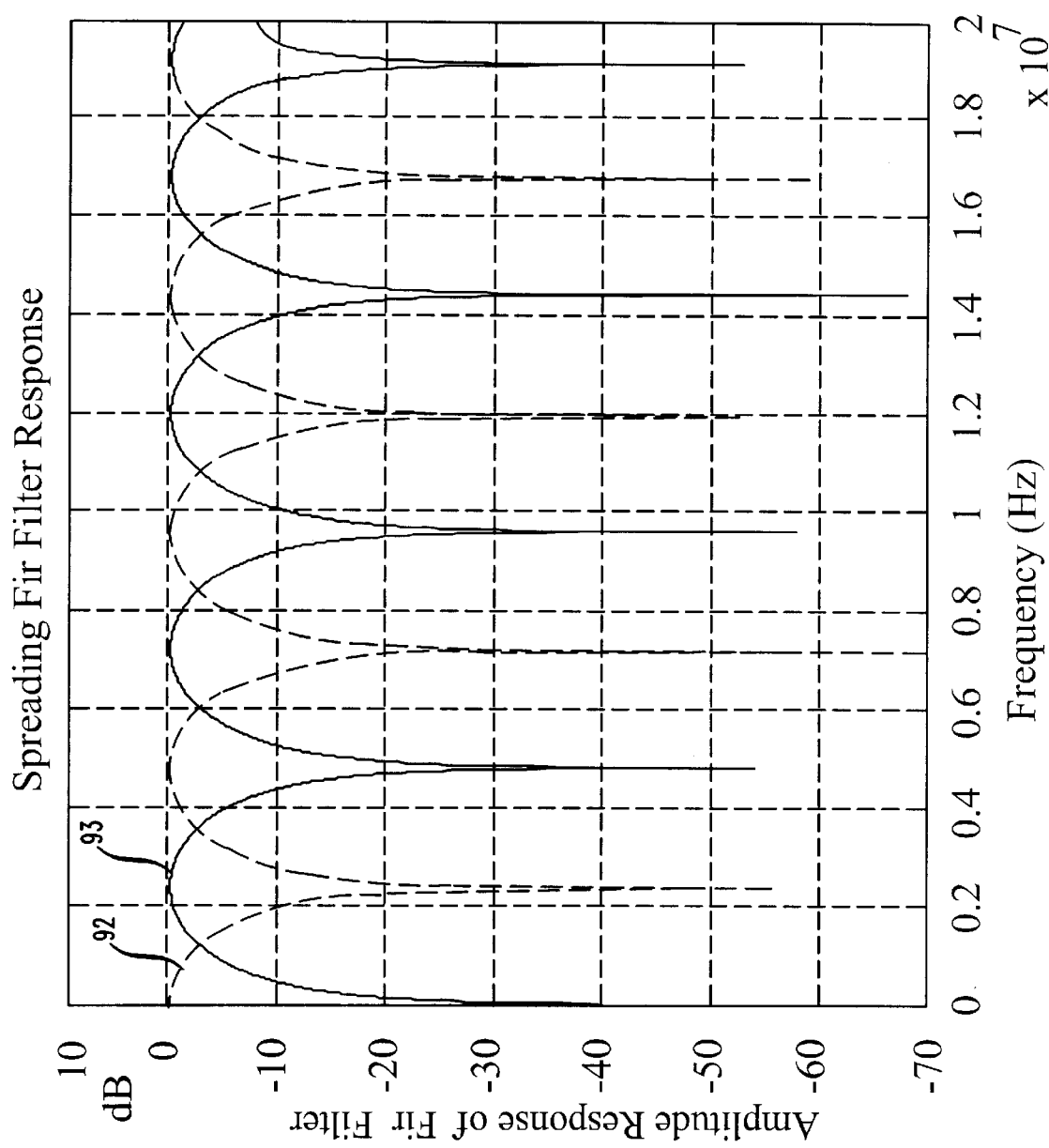
FIG. 11 shows the response in dB of a transfer function for a FIR filter implementing the transformation according to the principles of the present invention.

FIG. 11 shows a plot 92 of the (+) port and a plot 93 of the (−) port of digital comb filter implemented by a finite impulse response (FIR) filter. The filter transforms a signal S(t) into transformed signals X1(t) and X2(t) by zeroing (notch) at certain frequency location(s) to generate a transformed signal(s) with reduced PAR. For example, notches in $\pi/2$ or $\pi/2$ with respect to one carrier band offset from the center frequency f, of the carrier band produces a 3 dB reduction in PAR. The filtering can be applied recursively or in parallel. Other filters (in time or frequency) with similar characteristics or causing similar effects can be used to transform the original signal to a more power efficient format, such as a tapped delay line, raised cosine or sine filters.

Figure 12:
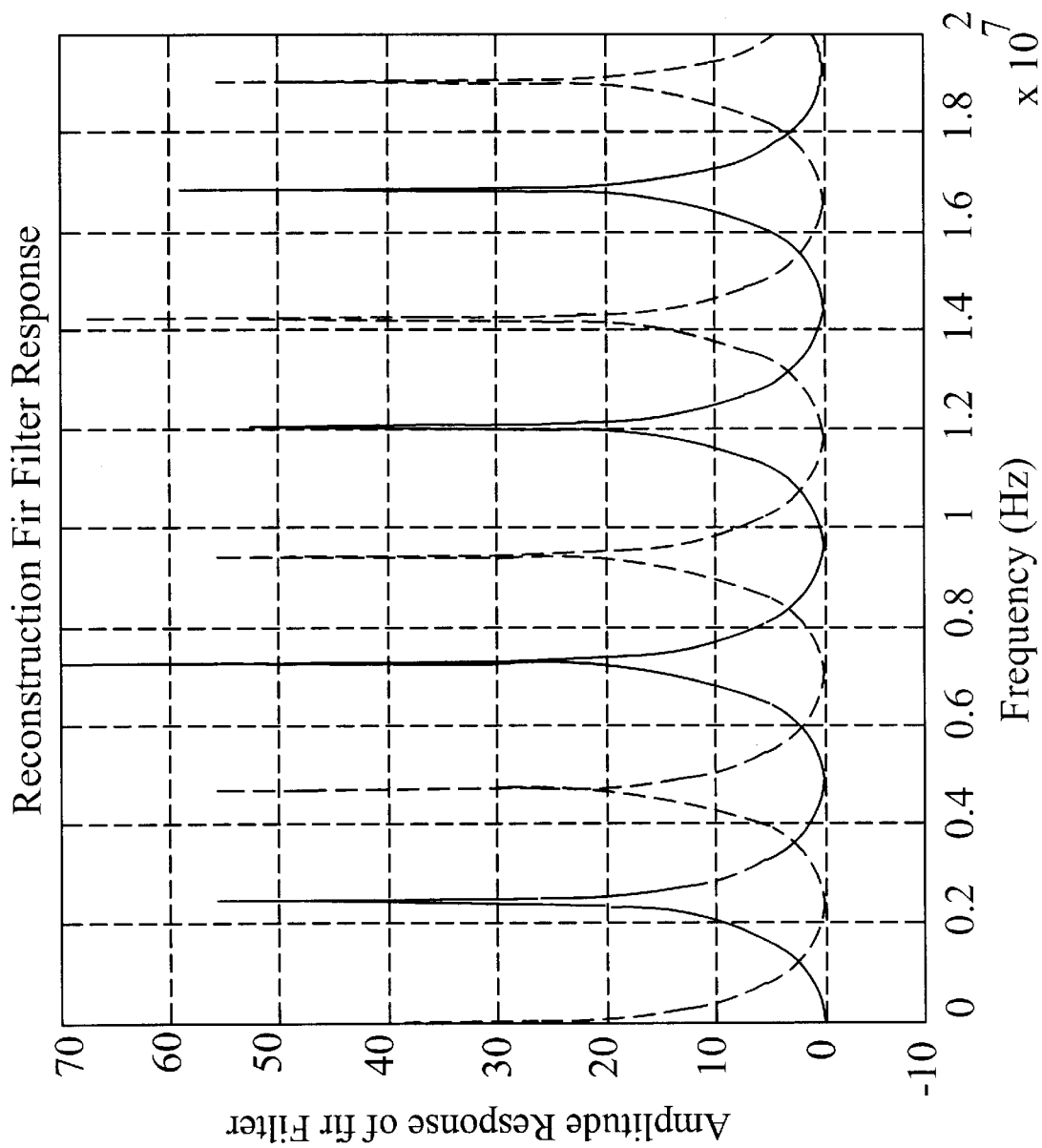
FIG. 12 shows the response in dB of a transfer function for a FIR filter implementing the reconstruction according to the principles of the present invention.

FIG. 12 shows an inverse filter response of a digital comb filter to reconstruct the original signal S(t) from the transformed signals X1 and X2. The inverse filter is comprised of poles corresponding to the notches of the digital comb filter response of FIG. 11. Examples of filters, which can be implemented to transform the original signal and/or reconstruct the original signal from power efficient intermediate signals at low loss are: delay line, delay filter (bandpass), comb filter(+/−), digital filter (finite impulse response (FIR/comb)), sin/cos filters, raised cos/sin filters, bandpass filters, notch filters, bandstop filters, orthogonal filters, wavelet filters, tapped delay(line) filters and/or resonator. To reduce the power loss at high power after signal amplification, other elements can be used such as various combinations of couplers (e.g., hybrid, directional, multiport, and/or circulators), delay elements and/or filters (e.g. bandpass, multirate filter banks). These elements are used to redirect the power (signals or portions of signals) that would otherwise be lost due to spectral shaping necessary to transform the original signal and reconstruct the transformed or intermediate signals. By adjusting respective frequency behavior of these filters, such as $f_c$, $f_{cutoff}$ and group delay, transformations and reconstructions are possible to reduce PAR.

Figure 13:
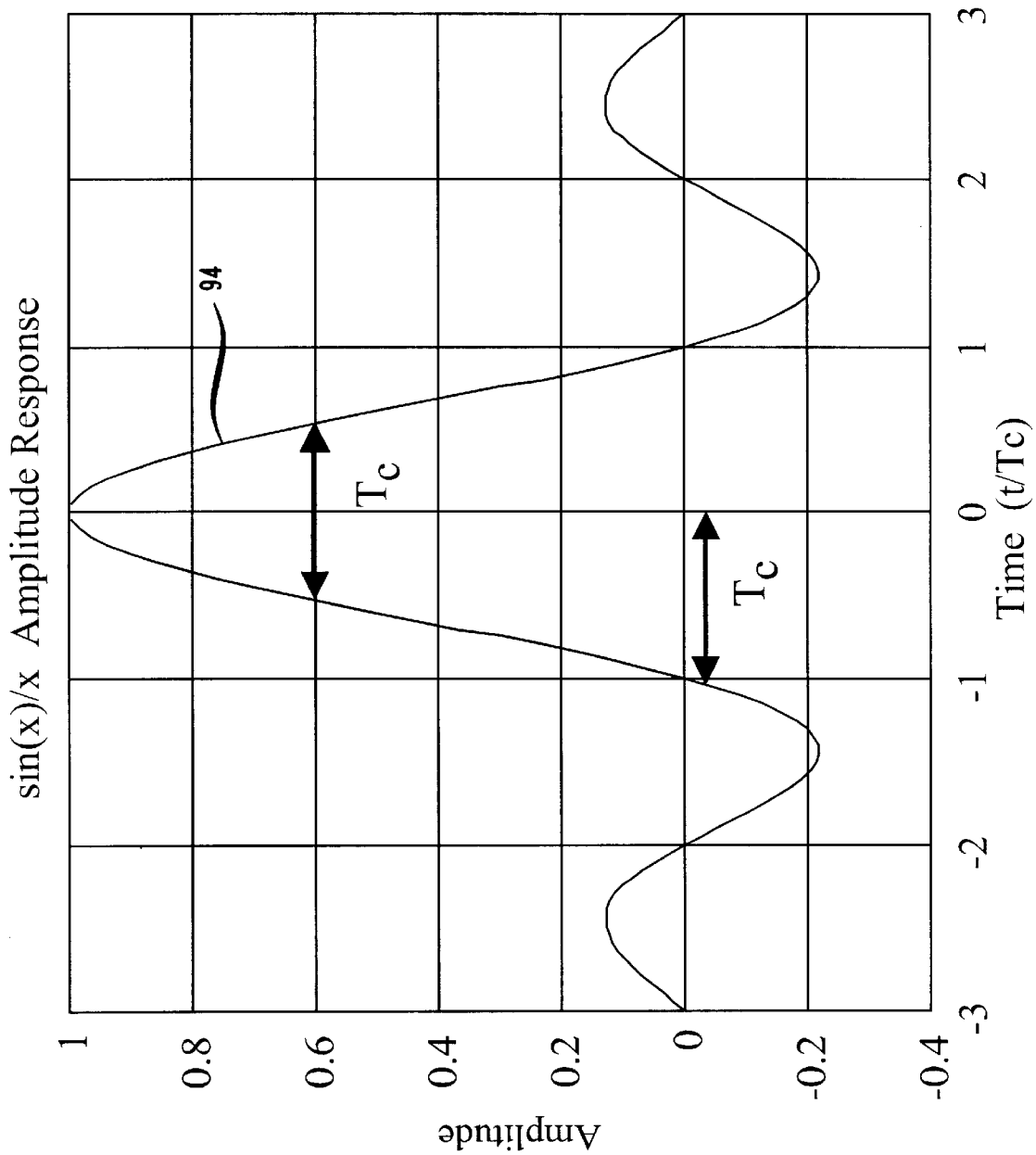
FIG. 13 shows the sin(x)/x amplitude response for a signal pulse to be transformed using a transformation according to the principles of the present invention.

The transformation can vary or be adjusted depending on the signal S(t) being transformed, for example multicarrier, multi-tone or gaussian, or the modulation used, such as QPSK, to provide the desired PAR. For example, FIG. 13 shows the envelope of a pulse 94 of a signal S(t) to be transformed. In this example, the signal 94 is a signal pulse shaped as a code-division multiple access (CDMA) system. A CDMA signal carries baseband data which has been spread and/or scrambled by multiplying the information signal with a spreading code sequence ("scrambling code sequence"), such as a pseudo-noise (PN) code which is a binary sequence that appears random but can be reproduced by the intended receiving station. A single pulse of the scrambling code sequence is called a chip. The signal pulse 94 has a sin(x)/x amplitude response. The signal pulse 94 can be characterized as a code division multiple access (CDMA) signal pulse having a power distribution as [sin(x)/x]$^2$ with a main lobe bandwidth (BW)=spreading code clock rate or chip rate and a chip interval $T_c$ of I/BW.

Figure 14:
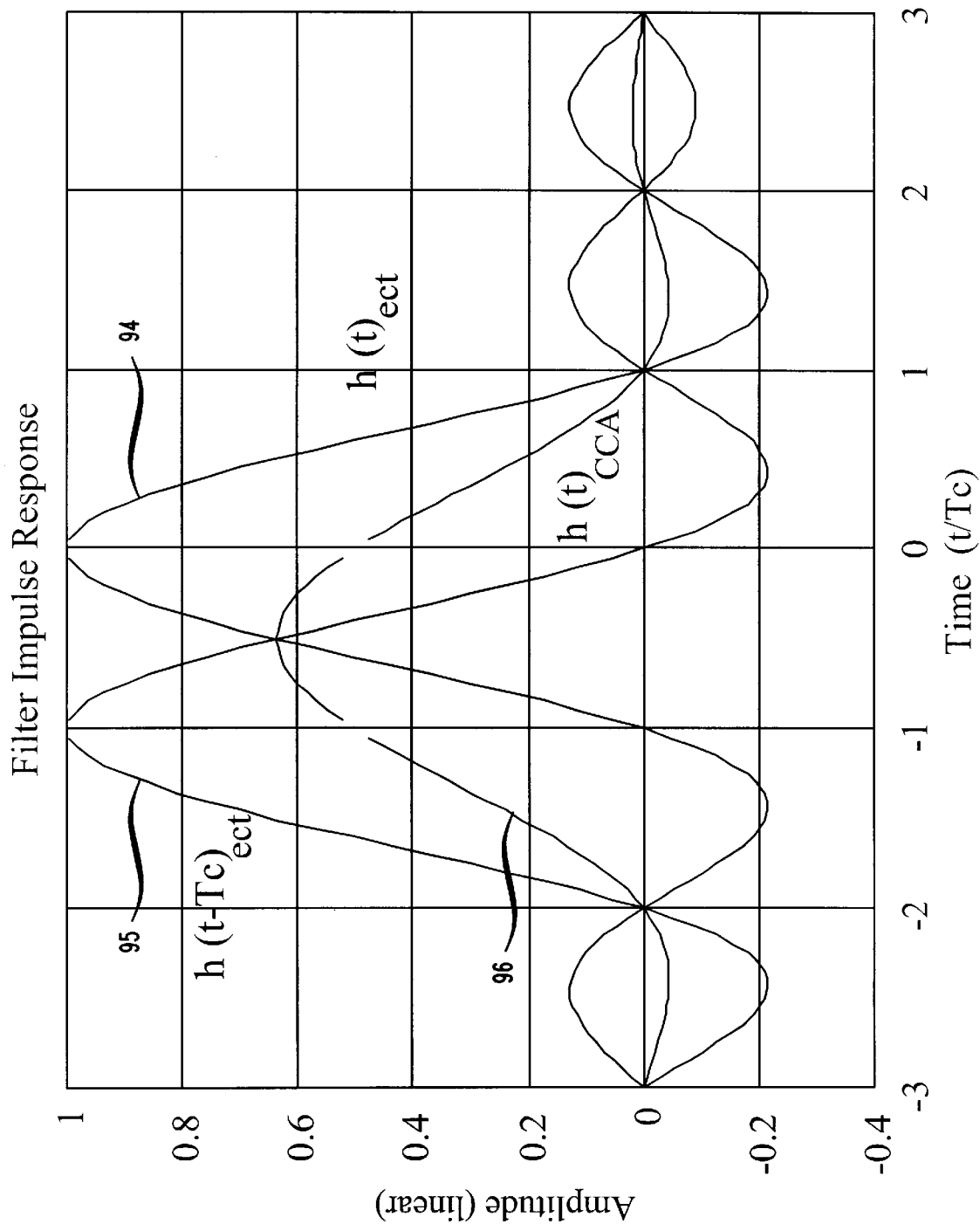
FIG. 14 shows the offset versions of the original signal and a transformed signal according to the principles of the present invention.

A transformation of the signal S(t) can be performed by a filter, such as a comb filter, having a filter impulse response $h(t)=[S(t)+/-S(t-T_d)]/2$ in the time domain and in the frequency domain $h^+(f)=\cos(\pi f T_d)e^{-j\pi f Td}$ and $h^-(t)=\sin(\pi f T_d)e^{-j\pi f Td}$. FIG. 14 shows the signal pulse S(t) (94) along with a delayed version 95 of the signal pulse 94. The transformation produces a transformed signal 96 in which the energy of the original signal S(t) is spread over more than one chip interval. In this example, transformed signal is equal to $[S(t)+S(t-T_d)]/2$.

The bandpass representation of the signal S(t) with in-phase (I) and quadrature (Q) components, for example a modulated signal using QPSK, can be $V_I\cos(\omega_c t)-V_Q$ sin($\omega_c t$) and the bandpasss representation of the delayed version S(t−Td) can be $V_I^d\cos(\omega_c t+\psi_i)+V_Q^d \sin(\omega_c t+\psi_i i)$, where $V_I$ and $V_Q$ are the envelopes of the I and Q components, $V_I^d$ and $V_Q^d$ are the envelopes of the delayed I and Q components and y is a phase, which can be zero, to fine tune the transformation or to provide power efficient combining. The transformation produces transformed signal $X1,2(t)=[S(t)+/-S(t-T_d)]/2$. If the in-phase (I) and quadrature (Q) components of the signal are already combined, the transformation can produce signals $X1(t)=\frac{1}{2}[g(t)+e^{-j\theta}g(t-T_d)]$ and $X2(t)=\frac{1}{2}[g(t)-e^{-j\theta} g(t-T_d)]$ where g(t) is the complex envelope of the modulated signal equal to be $V_I(t)+jV_Q(t)$ and $\theta=(\pi/4, \pi/2, \pi \ldots)$ Depending on the embodiment, the transformation can be performed at baseband on $V_I(t)$ and $V_Q(t)$. In this example, the average power of the transformed signals are equal to ½ the average power of the original signal, or $Pave(X1)=Pave(X2)=\frac{1}{2}\int X_i^2(t)dt= P_{ave}(S)/2$. The peak envelope power (PEP)=|max[g(t)]|$^2$/2= $[V^2_{Imax}+V^2_{Qmax}]/2$. As such, PEP (X)=PEP(S)/4, which leads to the conclusion that the PAR(X)=PAR(S)−3 dB given the delay $T_d=T_c$. Other embodiments are possible where the delay is less than or greater than the chip interval. In an alternative embodiment, the transformed signal(s) can be produced by combining the different signals $S_i(t)$ offset from each other, for example offset by ½ of a chip interval or less from each other. In certain embodiments, such as where the signal is modulated using binary phase shift keying (BPSK), a delay=$\pi/2$ can give a 3 dB peak reduction.

Figure 15:
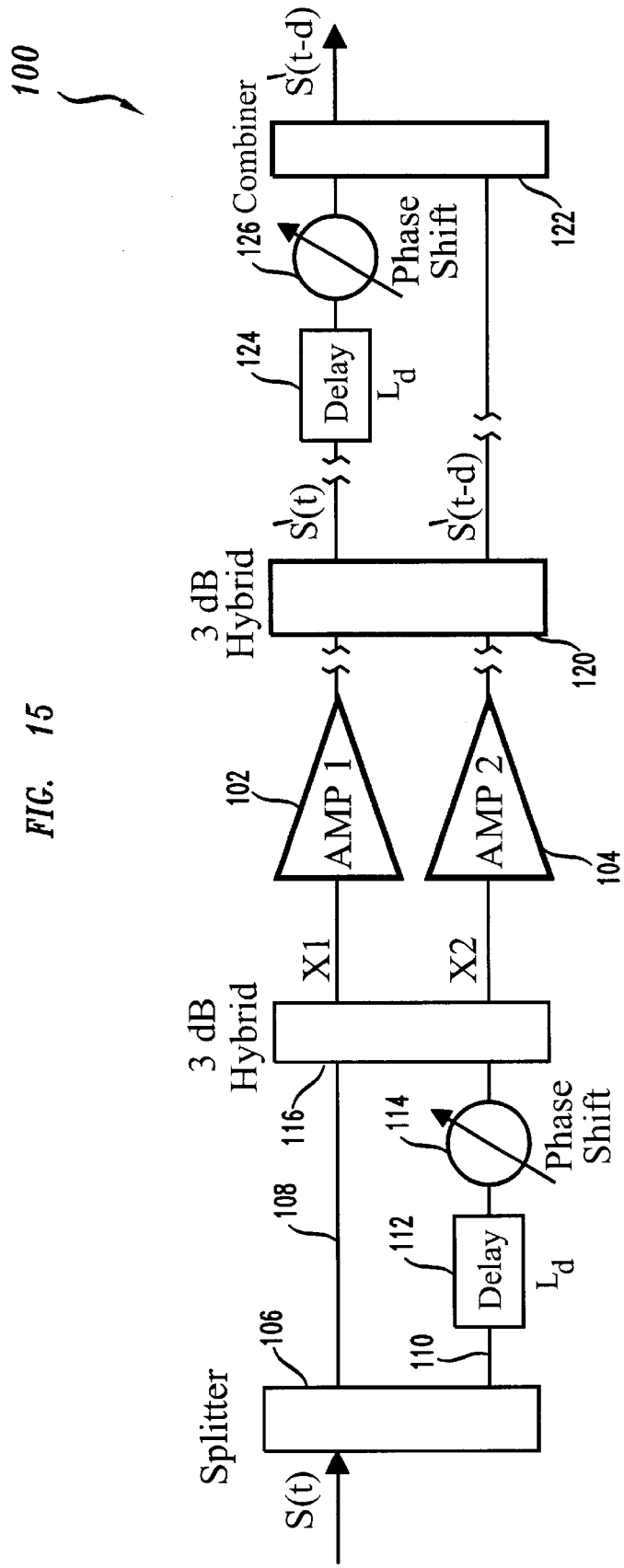
FIG. 15 shows an embodiment of the amplification system according to the principles of the present invention.

FIG. 15 shows an embodiment 100 where a multi-tone signal S(t) is transformed in a correlated manner prior to amplification by two amplifiers 102 and 104, and a version of the original signal is reconstructed after amplification. In this embodiment, a splitter 106 provides copies of the signal S(t) on a first amplifier path 108 and a second amplifier path 110. The signal on the second amplifier path 110 is delayed by a delay 112 and phase shifted by a phase shifter 114 relative to the signal on the first amplifier path 108. The phase shifter 114 shifts the phase of the signal on the path 110 by an amount to ensure the coupler combines the versions of the original signal S(t) on the paths 108 and 110 in a desired relationship to adjust for any mismatches in the various components and/or improve performance. A coupler 116, such as a 3 dB hybrid coupler, receives the signal on the first path 108 and the delayed, phase shifted signal on the second path 110 and combines the signals to produce intermediate or transformed signals X1 and X2. In this embodiment, the coupler 116 produces X1 by adding and subtracting versions of the original signal. Depending on the embodiment, the signal S(t) can be at baseband, and the functions of the components are performed at baseband, for example in a digital signal processor, but the signal S(t) can be at IF or RF.

The signal S(t) can be selectively separated into intermediate or transformed signals X1 and X2 for more efficient power amplification. For example, the signal S(t) can include two tones, for example separated by 10 MHz, and the delay 112 can produce a delay of 50 nanoseconds to the signal on the second path 110. In certain embodiments in the frequency domain, the delay d sec can produce nulls every 1/d Hz. As such, the signal S(t) can be selectively separated such that the transformed signal X1 corresponds to a first carrier and the transformed signal X2 corresponds to the second carrier. For example, X1 contains the energy for the first carrier and a reduced level of energy for the second carrier, and X2 contains the energy for the second carrier and a reduced level of energy for the first carrier. The selectively selected or transformed signals have a 3 dB improvement in PAR. In a signal S(t) with eight tones or carriers, for example split into two 4 tone signals separated by 10 MHz and a 50 nsec delay, the signal S(t) can be selectively separated into the two intermediate signals X1 and X2 which roughly correspond to four tones each. For example, X1 contains the energy for the first four tones and a reduced energy level for the second four tones, and X2 contains the energy for the second four tones, and a reduced level of energy for the first four tones. In such an example, an approximately 2.8 dB decrease in PAR is achieved.

The amplifier 102 amplifies the transformed signal X1, and the amplifier 104 amplifies the transformed signal X2. In this embodiment, the inverse transformation or reconstruction of the transformed signals into the original signal includes a coupler 120, such as a 3 dB hybrid coupler, which receives the amplified transformed signals from the amplifiers 102 and 104. The coupler 120 shifts and combines the amplified transformed signals to produce a delayed amplified version $$\frac{1}{\sqrt{2}} S'$$

(t−d) of the original signal S(t) and an amplified version $$\frac{1}{\sqrt{2}} S'$$

(t) of the original signal S(t). The amplified delayed version $$\frac{1}{\sqrt{2}} S'$$

(t−d) is fed to a combiner 122. The amplified version $$\frac{1}{\sqrt{2}} S'$$

(t) is delayed by a delay 124, for example by an amount corresponding to the delay 114, to produce a delayed amplified version $$\frac{1}{\sqrt{2}} S'$$

(t−d). A phase shifter 126 can shift the phase of the delayed amplified version $$\frac{1}{\sqrt{2}} S'$$

(t−d) from the delay 124 to adjust the relative phase between the combining signals to remove any mismatches or improve performance. The combiner 122 receives the amplified delayed version $$\frac{1}{\sqrt{2}} S'$$

(t−d) and the delayed amplified version $$\frac{1}{\sqrt{2}} S'$$

t−d) from the phase shifter 126 and combines the signals to produce the amplified version S'(t−d) of the original signal.

Figure 16:
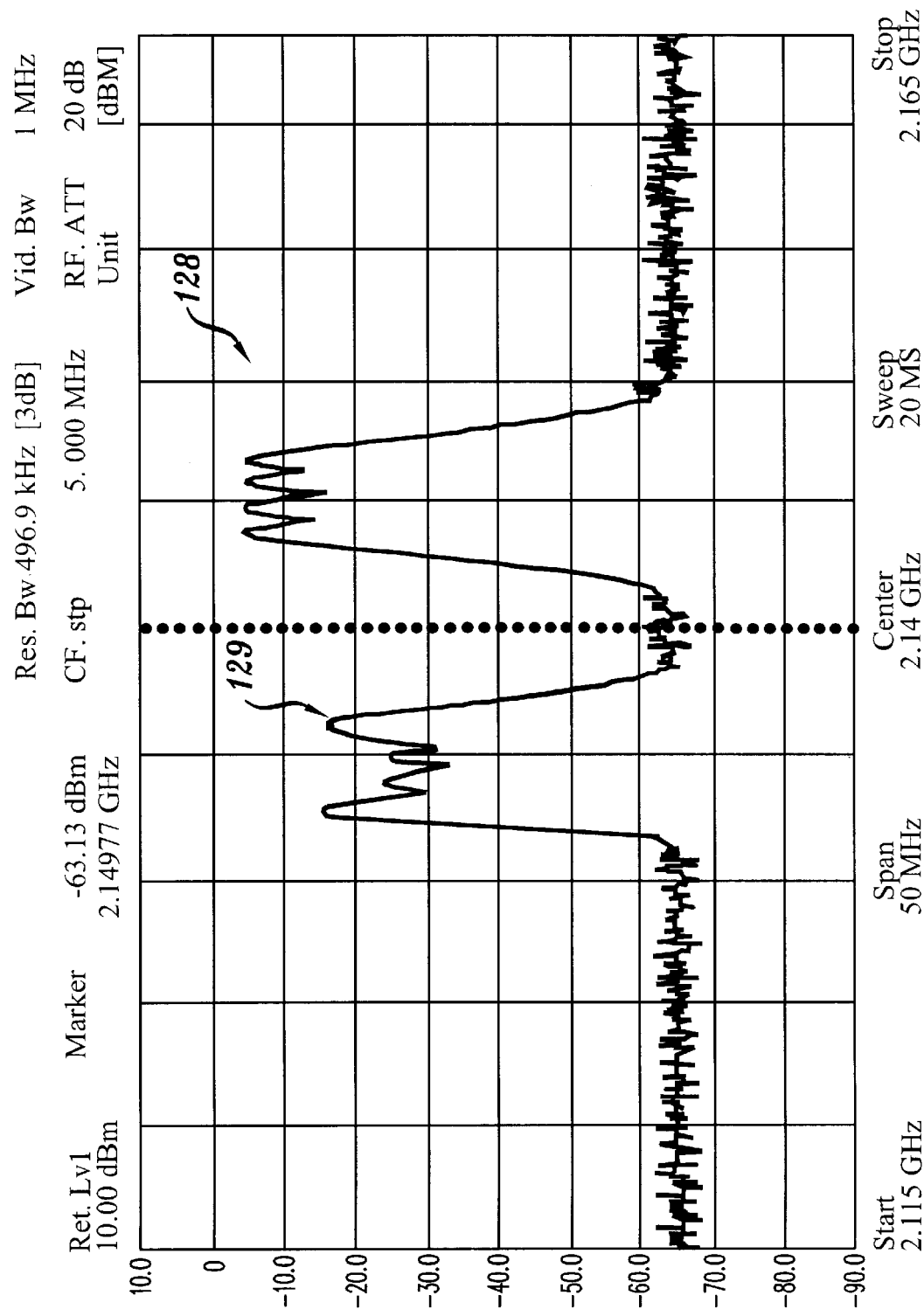
FIG. 16 shows a transformed signal in the frequency domain according to the principles of the present invention.

FIG. 16 shows a plot of an 8-tone signal which is transformed by selectively shaping the original signal or combining offset versions of the original signal to produce a transformed signal X1 (128). In producing the transformed signal X1, the transformation selectively shapes a portion 129 of the signal spectrum to reduce the amplitude of 4 of the 8 tones. In this embodiment, the system 100 (FIG. 15) would produce a transformed signal X2(not shown) in which the other portion of the signal spectrum is selectively shaped to reduce the other four tones of the eight tone signal. As such, the transformed signals X1 and X2 can be amplified in a more power efficient manner. For an eight tone signal in which four tones are selectively reduced in the transformed signals, the PAR for the transformed signal can be reduced from 9 dB to about 6 dB for about a 2.8 dB reduction in the PAR. A two tone signal in which a tone is reduced in the transformed signal produces transformed signals having constant envelope and producing a 3 dB reduction in PAR.

Figure 17:
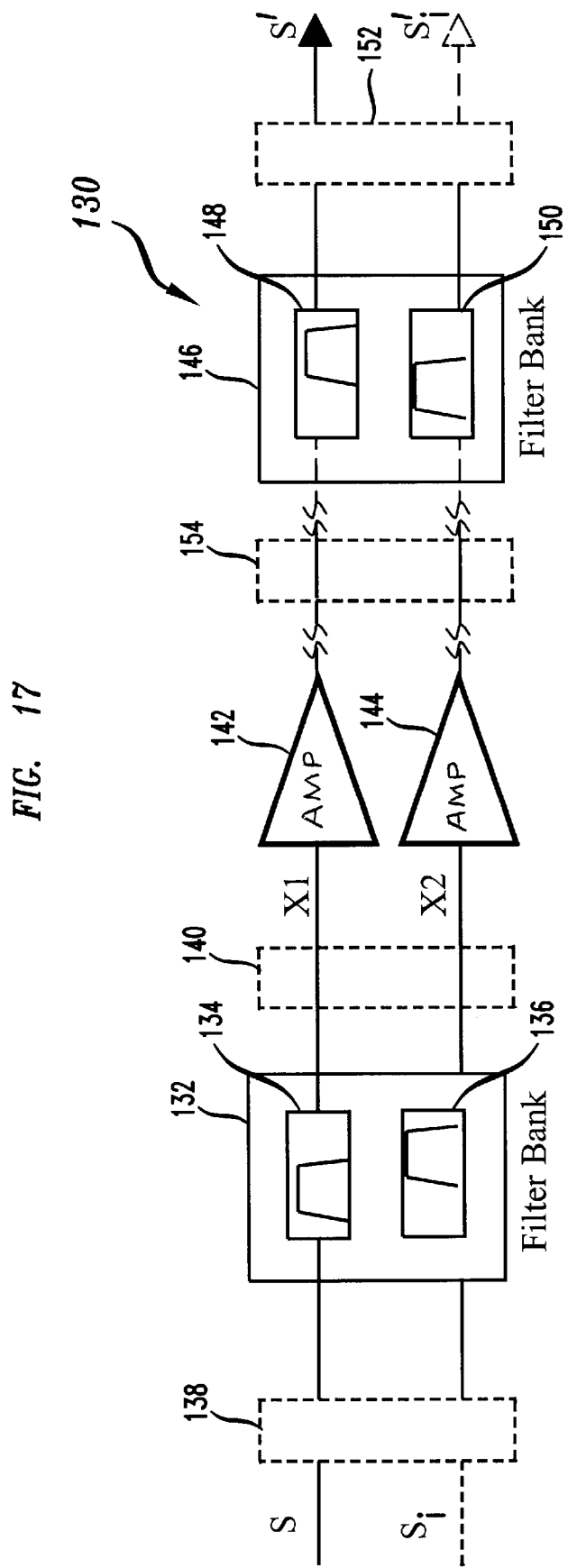
FIG. 17 shows an embodiment of the amplification system according to the principles of the present invention.

FIG. 17 shows an embodiment 130 for amplifying a signal S which can use a filter bank 132 to transform the original signal S (or signals $S_i$) into signal(s) which are more power efficient by selectively shaping different portions of the signal S (or signals $S_i$) in the frequency domain to spread the energy of the original signal(s) in the time domain or produce signal(s) with reduced PAR. As such, a signal with different carriers or tones can be selectively separated by reducing the amplitude(s) of n portions of the spectrum, for example corresponding to certain carrier or tone frequencies, to produce one or more transformed signals to be amplified then reconstructed. Depending on the embodiment, the filter bank 132 can include a single filter 134 or 136 or multiple filters. In certain embodiments, a splitter 138 provides replicas of the signal S(t) to two orthogonal filters 134 and 136, respectively. The filters 134 and 136 shape the frequency content of the different versions of the signal S(t) to improve the power efficiency of the transformed signals X1 and X2 compared to the power efficiency of the original signal S(t). Depending on the embodiment, a coupler or additional transforming circuitry 140 can further transform and/or correlate the filtered signals to produce the transformed signals X1(t) and X2(t). In alternative embodiments, multiple signals $S_i$ are transformed by the filter bank 132 (and coupler(s) depending on the implementation) by shaping and/or combining or averaging the different signals $S_i(t)$ or versions thereof in a controlled manner to enable a reconstruction of versions of the original signals $S_i$.

In a multiple carrier system, the overall power efficiency is improved for amplifying the signal S(t) by transforming the signal S(t) as one large bandwidth (for example, transforming multiple signals in the same, separate or overlapping frequency bands) and/or selective separation (in the frequency domain) or shaping of different frequency bands, for example filters 134 and 136 can selectively shape different portions of the spectrum in producing transformed signals X1(t) and X2(t) which each include a carrier or set of carriers. In the time domain, the filter(s) 134 and/or 136 could impart a delay(s) on version(s) of the original signal S(t), and the coupler 140 combines and correlates the resulting versions of the original signal to produce the transformed signals X1 and X2. After the transformed signals X1 and X2 are respectively amplified by amplifiers 142 and 144, an inverse filter bank 146 performs an inverse transformation on the amplified transformed signals which are recombined to produce the original signal S(t). For example, the amplifiers 142 and 144 amplify the transformed signals X1(t) and X2(t), which could correspond to carrier(s)1 and carrier(s)2.

Depending on the embodiment, the inverse filter bank 146 can include a single filter 148 or 150 or multiple filters 148 and 150. The filter(s) 148 and/or 150 could impart a delay(s) on the amplified transformed signal(s) corresponding to the delay imparted by the filter 136 and/or 134, respectively. Depending on the embodiment, the filter 148 can correspond to the filter 136, and/or the filter 150 can correspond to the filter 134. Alternatively, the filter 148 can be the inverse of the filter 134; and/or the filter 150 can be the inverse of the filter 136. In this embodiment, the filters 148 and 150 perform an inverse transformation on the amplified transformed signals. The resulting signals are recombined to produce the original signal S(t). In this embodiment, a combiner 152 combines the inversely transformed signals to produce a version of the original signal S'. If a coupler or transforming circuitry 140 is used, then coupler or inverse transforming circuitry 154 could be used as part of the recombination or inverse transformation of the amplified transformed signals into the original signal S(t). In an alternative embodiment, original carriers or sets of carriers can be directly provided to transformation circuitry prior to amplification. In such an embodiment, the carrier(s) signals, the transformed signals X1(t) and X2(t) are transformed such that the amplified transformed signals can be combined in phase after amplification. The carrier signal(s) are transformed to establish a relative phase relationship or correlation between the carrier signals.

Figure 18:
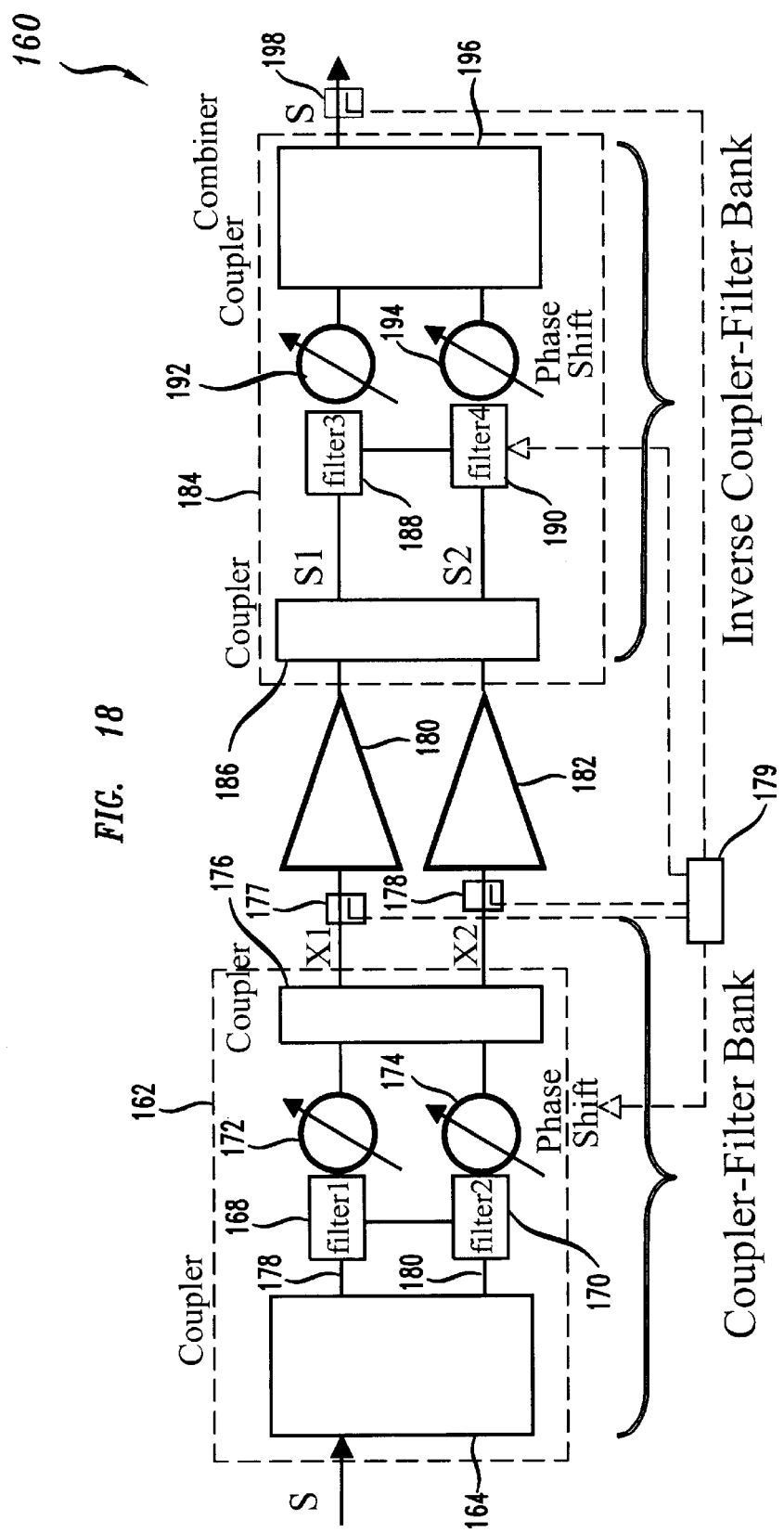
FIG. 18 shows an embodiment of the amplification system according to the principles of the present invention.

FIG. 18 shows an embodiment 160 in which a transformation 162 uses a coupler-filter bank arrangement which includes a combination of a coupler 164, filters 168 and 170, phase shifters 172 and 174, and coupler 176 to transform the original signal S to transformed signals X1 and X2 for amplification. Depending on the embodiment, the transformation can be performed using different combinations of components and/or using additional couplers or components or omitting some components, such as the filter 168 or 170 and the phase shifters 172 and/or 174. In this embodiment, the coupler 164 provides replicas of the signal S onto a first amplifier path 178 and a second amplifier path 180. A first version of the original signal from the coupler 164 is filtered by the filter 168, and a second version of the original signal is filtered by a filter 170. The filters 168 and/or 170 selectively shape the first and second versions of the original signal to reduce the energy in different frequency portions in the frequency domain and/or to produce a relative delay between the versions of the original signal in the time domain to spread the energy of the original signal over time. The phase shifters 172 and 174 can adjust the relative phase between the two versions of the signal S to provide the desired combining of the versions of the original signal by the coupler 176. For example, the phase shifters 172 and/or 174 can adjust for mismatches between the filters 168 and 170, to adjust for changing operating parameters and/or to provide the desired combining of the transformed signals. Depending on the embodiment, the phase shifters 172 and/or 174 can adjust the phase based on feedback. For example, couplers 177 and/or 178 can provide sample(s) of the signal X1 and/or X2 to control circuitry 179 which provides control signals to phase shifter(s) 172 and/or 174 to improve the transformation, for example by improving the power efficiency of the signal(s).

The transformed signal X1 is amplified by amplifier 180, and the transformed signal X2 is amplified by an amplifier 182. The amplified transformed signals are received by an inverse transformation 184 to de-spread the energy of the amplified transformed signals in time and recreate the original signal S. Depending on the embodiment or the transformation performed above, the inverse transformation can be performed using different combinations of components and/or using additional couplers or components or omitting some components, such as the filter 188 or 190 and the phase shifters 192 and/or 194. In this embodiment, the coupler 164 provides replicas of the signal S onto a first amplifier path 178 and a second amplifier path 180. In this embodiment, the amplified transformed signals are received by an inverse coupler-filter bank which includes a coupler 186 to shift and combine the amplified transformed signals to provides the processed signal S1 and S2. The signal S1 is provided to a filter 188, and the signal S2 is provided to a filter 190. Depending on the embodiment, the filter 188 can correspond to the filter 170, and/or the filter 190 can correspond to the filter 168. Alternatively, the filter 188 can be the inverse of the filter 168; and/or the filter 190 can be the inverse of the filter 170.

In any event, the filters 188 and/or 190 perform an inverse transformation on the processed signals as the transformation performed by the filters 168 and/or 170. Phase shifters 192 receive the filtered signals and perform a relative phase adjustment to the filtered signals to provide a desired phase relationship between the signals to provide the desired combination of the signals by a coupler 196 to reconstruct or de-spread the energy of the signal S in time. The phase shifters 192 and/or 194 can adjust for mismatches between the filters 188 and 190, to adjust for changing operating parameters and/or to provide the desired combining of the transformed signals. Depending on the embodiment, the phase shifters 192 and/or 194 can adjust the phase based on feedback and/or provide a phase shift corresponding to that of the phase shifters 170 and/or 168. For example, a couplers 198 can provide a sample of the signal S to the control circuitry 179 which provides control signals to phase shifter (s) 192 and/or 194 to improve the reconstruction.

Figure 19:
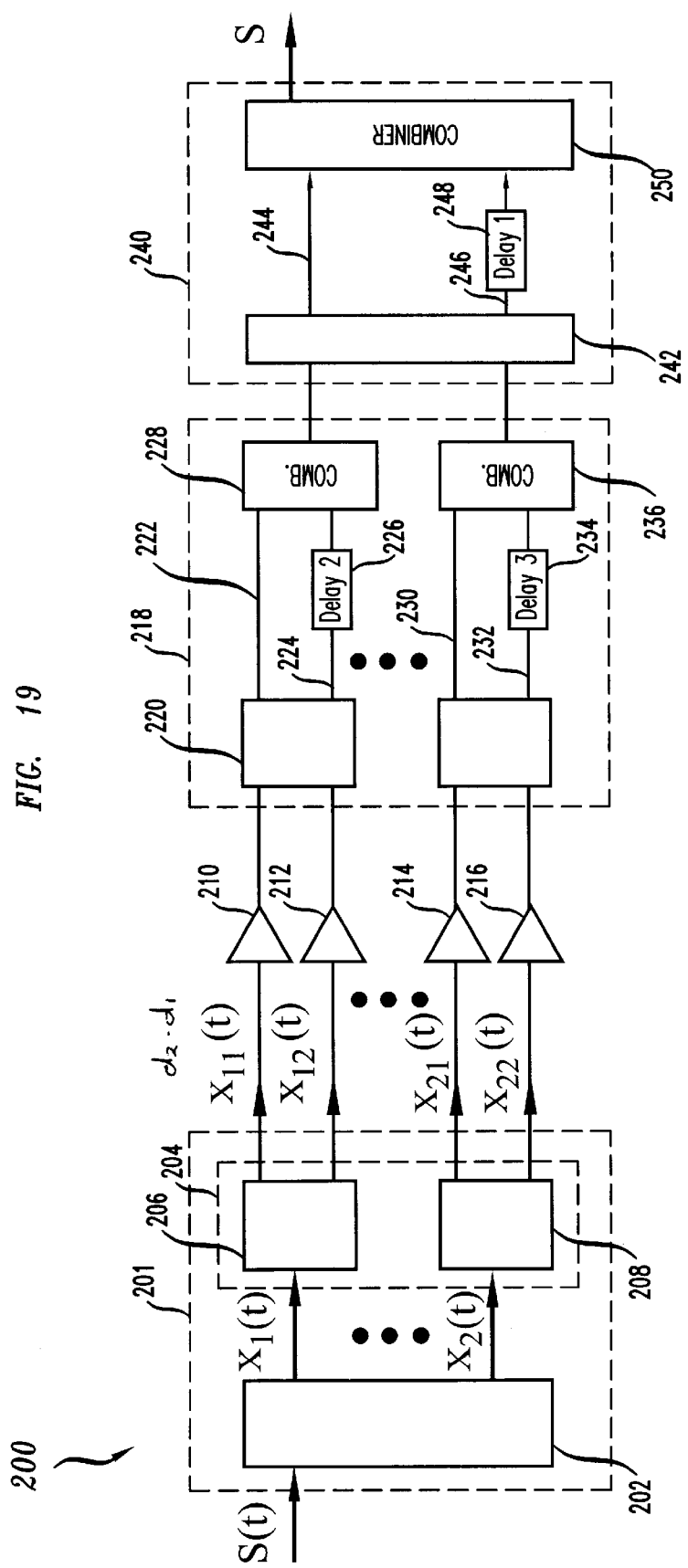
FIG. 19 shows a multiple layer transformation/reconstruction embodiment of the amplification system according to the principles of the present invention.

FIG. 19 shows an embodiment 200 using a transformation 201 using multiple layers of transformations or a recursive transformation to provide transformed signals for amplification. A first transformation or first transformation layer 202 is performed on the signal S(t) to be amplified. The first transformation 202 combines a version of the signal S(t) with a delayed version (S(t−d1)) where the delay d1 is selected to produce a reduced PAR in the transformed signals X1 and X2. In this embodiment, the first transformation 202 produces a first set or layer of transformed signals X1(t)=½[S(t−d1)+S(t)] and X2(t)=½[S(t−d1)−S(t)]. The first set of transformed signals X1(t) and X2(t) is provided to a second transformation 204 or second transformation layer which combines delayed version(s) of the transformed signals X1(t) and X2(t) to spread the energy in time of the transformed signals X1(t) and X2(t).

In this embodiment, the transformed signal X1(t) is provided to a nested transformation 206 which produces a second set or layer of multiple transformed signals $X_{11}(t)=$ ½[X1(t−d2)+X1(t)] and $X_{12}(t)=$½[X1(t−d2)−X1(t)] where d2 is the amount of delay experienced by a version of the transformed signal X1(t). The delay d2 is selected to reduce the PAR of the transformed signal X1(t). The transformed signal X2(t) is provided to a transformation 208 which is a second or nested layer of transformation to produce a set of transformed signals $X_{21}(t)=\frac{1}{2}[X2(t-d3)+X2(t)]$ and $X_{22}(t)=\frac{1}{2}[X2(t-d3)-X2(t)]$ where d3 is the amount of delay experienced by a version of the transformed signal X2(t). The delay d3 is selected to reduce the PAR of the transformed signal X2(t). As such, the multi-layer transformed signals have a reduced overall PAR through the amplifiers 210, 212, 214 and 216. Since peak pulses in X1 and X2 are more flat than the ones in S(t), d2 and d3 may need to be larger than d1. Statistically, d2 and d3 may be of the same magnitude. In case of larger sets of transformed signals, d1 can change depending on the characteristics of S(t). The number of layers can be increased for further reduction in the PAR or spreading of energy in time and the number of amplifiers would increase with losses in the delay elements being a limiting factor.

The amplified multiple transformed signals from the amplifiers 210, 212, 214 and 216 are provided to an inverse transformation 218 which de-spreads the energy of the amplified multiple transformed signals to produce amplified transformed signals X1 and X2. In this embodiment, the amplified multiple transformed signals $X_{11}'(t)$ and $X_{12}'(t)$ are provided to a coupler 220 which shifts and combines the amplified multiple transformed signals and provides combined versions of the amplified transformed signal X1. A first version is equal to $1/\sqrt{2}*X1'(t-d2)$ on the path 222 and a second version is equal to $1/\sqrt{2}*X1'(t)$ on the path 224. A delay 226 on the path 224 provides a delay d2 to the second version to produce a version of the amplified signal $1/\sqrt{2}*X1'(t-d2)$ on the path 224. The delay d2 offsets or removes the delay d2 introduced in the transformation 206, effectively de-spreading the versions of the amplified transformed signals $X_{11}'(t)$ and $X_{12}'(t)$. As such, the delay 226 produces a version of the amplified signal $1/\sqrt{2}*X1'(t-d2)$. A combiner 228 combines the version of the amplified signal $1/\sqrt{2}*X1'(t-d2)$ on the path 222 and the version of the amplified signal $1/\sqrt{2}*X1'(t-d2)$ from the delay 226 to produce the transformed signal X1'(t-d2).

Furthermore, in this embodiment, the amplified transformed signals $X_{21}'(t)$ and $X_{22}'(t)$ from the amplifiers 214 and 216 are provided to a coupler 220 which shifts and combines the amplified multiple transformed signals and provides versions of the amplified transformed signals X2'(t). A first version is produced on a path 230 equal to $1/\sqrt{2}*X2'(t-d3)$, and a second version is produced on a path 232 equal to $1/\sqrt{2}*X2'(t)$. A delay 234 on the path 232 provides a delay d3 to the second version to produce a version of the amplified signal $1/\sqrt{2}*X2'(t-d3)$ on the path 234. The delay d3 offsets the delay d3 introduced in the transformation 206, effectively de-spreading the energy of the amplified signals $X_{21}'(t)$ and $X_{22}'(t)$. As such, the delay 234 produces a version of the amplified signal $1/\sqrt{2}*X2'(t-d3)$. A combiner 236 combines the version of the amplified signal $1/\sqrt{2}*X2'(t-d3)$ on the path 230 and the version of the amplified signal $1/\sqrt{2}*X2'(t-d3)$ from the delay 234 to produce the transformed signal X2'(t-d3).

The amplified transformed signals X1'(t-d2) and X2'(t-d3) from the inverse transformation 218 are provided to a second inverse transformation 240 or second layer of inverse transformation to further de-spread the energy of the amplified transformed signals in time to reconstruct the amplified original signal. In this embodiment, a coupler 242 receives the first amplified transformed signal X1'(t-d2) and the second amplified transformed signal X2'(t-d3). The coupler 242 shifts and combines the amplified transformed signals X1'(t-d2) and X2'(t-d3) to produce a first version of the original signal. If d2=d3, the first version of the original signal can be produced on a path 244 as $\sqrt{2}$ IS'(t-d1-d2), and the second version of the original signal can be produced on a path 246 as $\sqrt{2}*S'(t-d2)$. A delay 248 on the path 246 can delay the second version $\sqrt{2}*S'(t-d2)$ of the original signal by an amount d1 corresponding to the delay d1 of the first transformation 202 to produce a version $\sqrt{2}*S'(t-d1—d2)$. A combiner 250 receives the version $\sqrt{2}*S'(t-d1-d2)$ on the path 244 and the version $\sqrt{2}*S'(t-d1-d2)$ from the delay 248 and combines the versions to de-spread the energy of the amplified transformed signals to produce an amplified version of the original signal S'(t-d1-d2). Depending on the embodiment, the transformation 201 can be performed in parallel to produce transformed signals $X_{11}(t)$, $X_{12}(t)$, $X_{21}(t)$ and $X_{22}(t)$ as well as the reconstruction 218 to produce the signal S.

Figure 20:
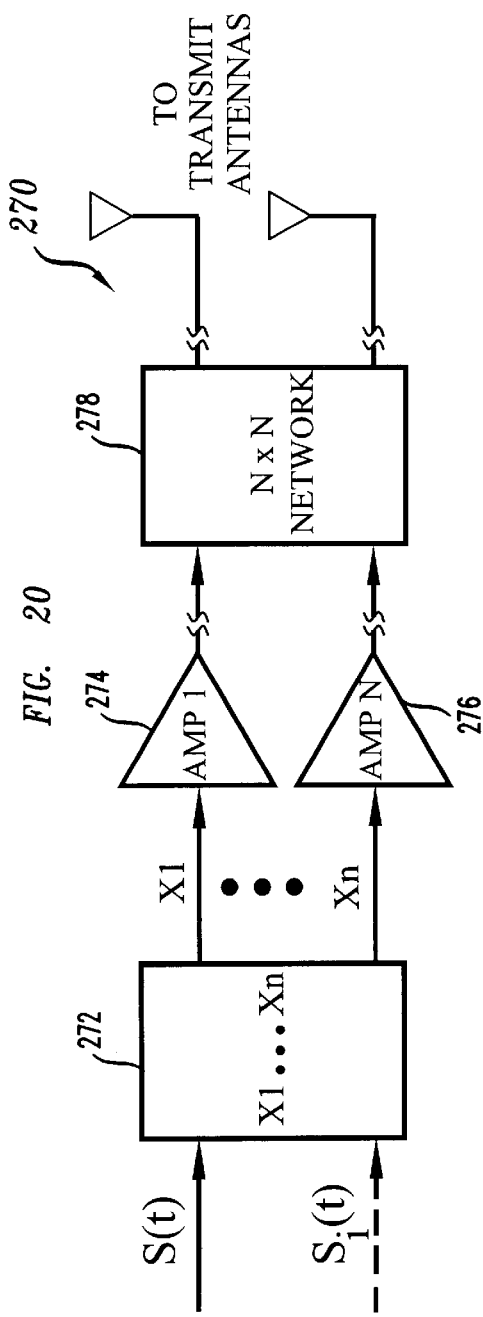
FIG. 20 shows an amplification system enabling signal diversity in transmitting to a receiver according to principles of the present invention.

FIG. 20 shows a signal amplification system 270 in which the original signal S(t) (or signals $S_i(t)$) is transformed by block 272 into transformed signals X1–Xn which are amplified in a more power efficient manner and the transformed signals or processed versions thereof are transmitted to provide transmit diversity for reconstruction of received versions of the original signal(s) at the receiver. In an embodiment where n=2 and the transformation block 272 receives an original signal S(t), the transformation block 272 generates transformed signals X1=cos (ωc t+ϕ+θ) and X2=cos (ωc t+ϕ−θ) where θ=$\cos^{-1}$ (S(t)). In this example, 4 contains the phase information of the original signal S(t) and θ contains the amplitude information for the original signal S(t). As such, the phase information of the original signal S(t) is retained in the transformed signals X1 and X2, and the amplitude information of the original signal is converted into phase information in the transformed signals X1 and X2. As such, in this embodiment, each transformed signal is phase-modulated and has a constant envelope which translates into a peak to average power ratio of 0 dB for the transformed signals. Other transformations are possible to produce transformed signals according to the principles of the present invention. For example, a transformations of signals Si(t) can be performed, for example to reduce the PAR of the transformed signals for amplification and transmission over multiple transmit antennas after any further processing. The resulting transmitted signals are transmitted, for example diverse signals transmitted on multiple antennas, and reconstructed at the receiver, for example after being received on multiple antennas.

The transformed signals X1 to Xn are amplified by amplifier 274 (AMP1) and amplifier 276 (AMPn), respectively. In the example where n=2, since the transformed signals X1 and X2 have a constant envelope, the amplifiers AMP1 to AMP2 can be less costly and be operated in a power efficient yet linear fashion. The resulting amplified, transformed signals X1 and X2 can be transmitted, for example using different transmit antennas for transmission to a receiver which inversely transforms the signals to reconstruct the original signal. Alternatively, the amplified, transformed signals can be inversely transformed after amplification prior to transmission. In this embodiment, the amplified transformed signals are provided to an NXN network 278, such as a coupling arrangement including a 90 degree hybrid coupler and/or a 180 degree hybrid coupler. For example, if n=2, the amplified transformed signals X1 and X2 are provided to a 2×2 network. In this example, the 2×2 network 278 provides processed signals S1=F1(S(t))*sin (ωc t+ϕ) and S2 F2(S(t))*cos(ωc t+ϕ), where F1(S(t))= S(t) and $F2(S(t))[1-S^2(t)]^{1/2}$.

Figure 21:
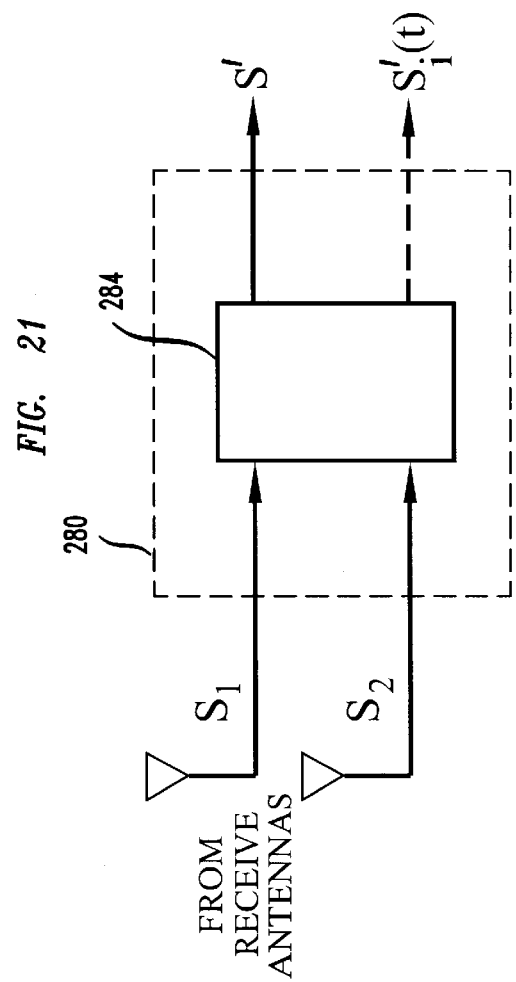
FIG. 21 shows a receiver in which received signals are reconstructed according to principles of the present invention.

The processed signals S1 and S2 can be provided to the transmit circuitry and antenna(s) for transmission. In such an embodiment, the processed signals can be received at the receiver on receive antenna(s) and subjected to reconstruction 280 to Io reconstruct a version S' of the original signal S as shown in FIG. 21. In such an embodiment, the processing by the network 278 can be part of the inverse transformation or an additional processing step. If an additional processing is performed at network 278, the reconstruction 280 of the received signals S1 and S2 to the signal S' can include further processing beyond the inverse transformation to convert the processed signals S1 and S2 to a version of the transformed signals X1 and X2. In this embodiment, the network 278 processes the transformed signals X1 and X2 as part of the inverse transformation, and the reconstruction 280 takes the processed signals S1 and S2 and performs the remainder 284 of the inverse of the transformation used to convert the original signal S(t) to the transformed signals X1 and X2 in block 272. As such, the inverse transformation 284 shifts and combines the processed signals S1 and S2 to produce a version S' of the original signal S. Alternatively, the amplified transformed signals X1 and X2 could be transmitted without additional processing, and the inverse transformation performed at the receiver to reconstruct the original signal from the transmitted, amplified transformed signals X1 and X2 with the network or processing block 278 (FIG. 20) at the receiver. Alternative embodiments are possible in which additional processing or processing is added and/or deleted from the transmitter and/or receiver.

Figure 22:
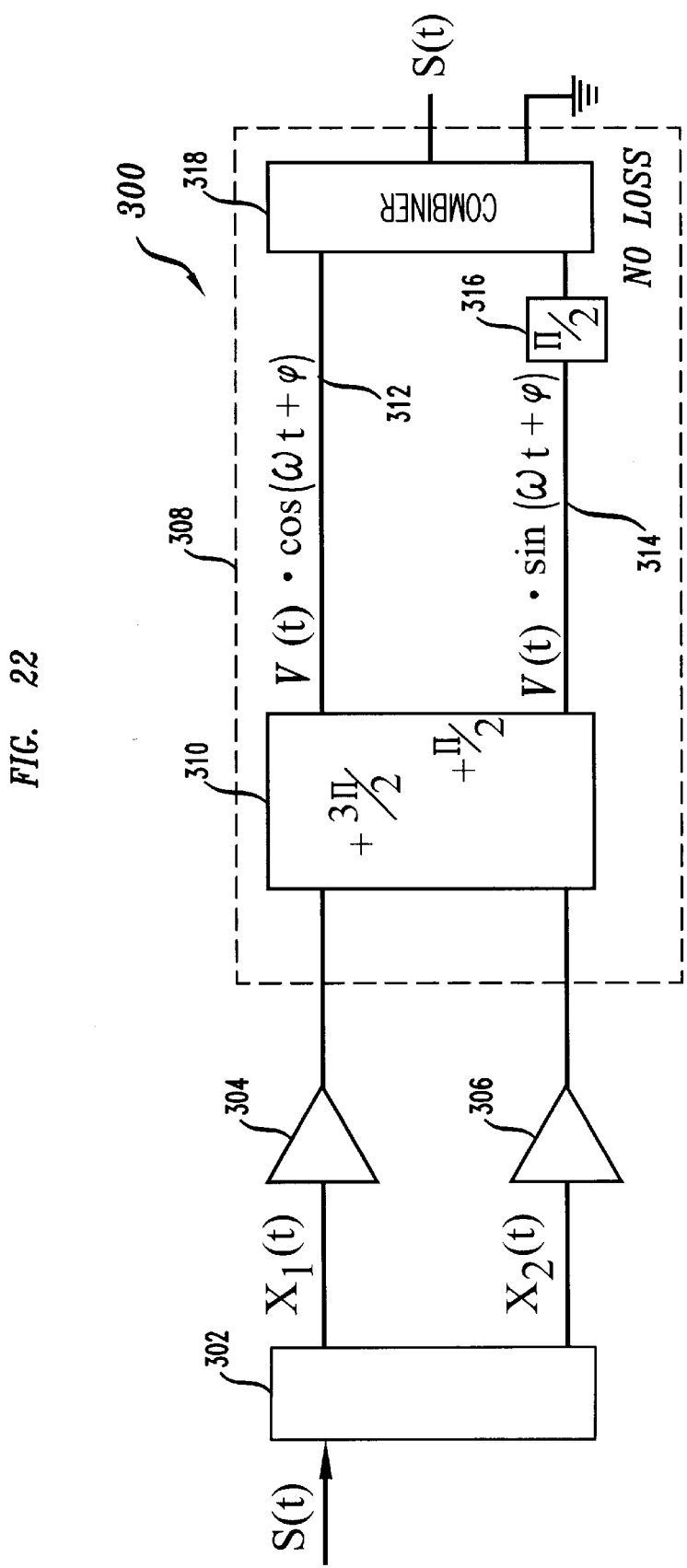
FIG. 22 shows an embodiment of the amplification system using a 3π/2 coupler according to the principles of the present invention.

FIG. 22 shows an embodiment 300 of an amplification system in which phase shifted versions of the original signal S(t) are combined in a transformation 302 to produce transformed signals X1(t) and X2(t). Amplifiers 304 and 306 amplify the transformed signals X1(t) and X2(t) to provide amplified transformed signals X1(t) and X2(t). In this embodiment, the transformation 302 can produce transformed signals X1(t)=½ cos($\omega c$ t +$\phi$+$\theta$) and X2(t)=½ cos ($\omega c$ t+$\phi$−$\theta$−$\pi/2$) where $\theta$=cos$^{-1}$ (S(t)). In this example, $\phi$ contains the phase information of the original signal S(t), $\theta$ contains the amplitude information for the original signal S(t) and the $\pi/2$ is the phase shift introduced in the transformation to the transformed signal X1(t). After amplification, a reconstruction 308 is performed on the amplified transformed signals X1(t) and X2(t) to produce a version S' of the original signal S. In this embodiment, the reconstruction of the amplified transformed signals X1(t) and X2(t) is performed at RF prior to transmission. To do so, the reconstruction 308 includes a $3\pi/2$ coupler 310 which combines the inputs with a $3\pi/2$ and $\pi/2$ relative phase difference to produce V(t)cos($\omega c$ t+$\phi$) on the path 312 and V(t) sin($\omega c$ t+$\phi$)) on the path 314. On the path 314, a phase shifter 316 shifts the phase of the signal on the path 314 by $\pi/2$, resulting in a signal V(t)cos($\omega c$ t+$\phi$). The signal V(t) cos($\omega c$ t+$\phi$) on the path 312 and the signal V(t)cos($\omega c$ t+$\phi$) from the phase shifter 316 are provided to a combiner 318 which combines the signals to produce a phase-shifted amplified version S' of the original signal S.

Figure 23:
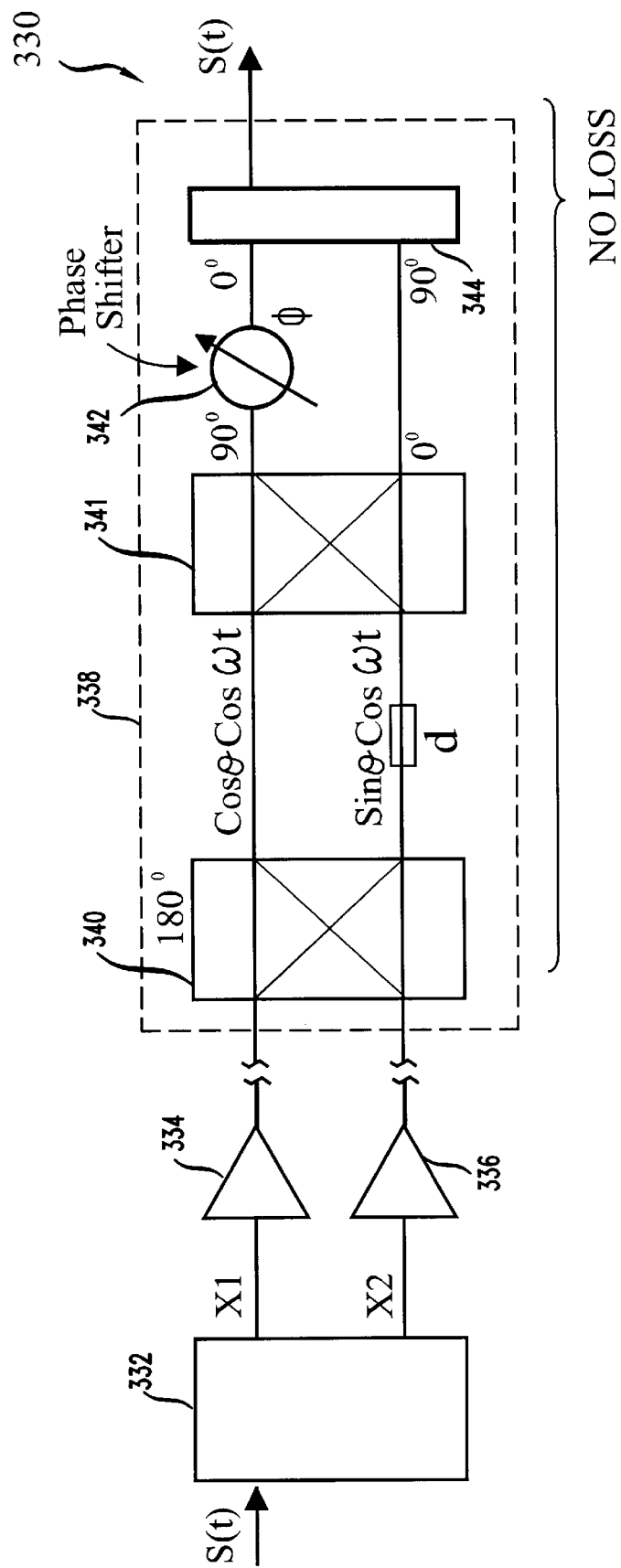
FIG. 23 shows an embodiment of the amplification system using a variable combiner according to the principles of the present invention.

FIG. 23 shows an embodiment 330 of an amplification system in which phase shifted versions of the original signal S(t) are combined in a transformation 332 to produce transformed signals X1(t) and X2(t). Amplifiers 334 and 336 amplify the transformed signals X1(t) and X2(t) to provide amplified transformed signals X1(t) and X2(t). In this embodiment, the transformation 332 can produce transformed signals X1(t)=½ cos($\omega t$+$\phi$+$\theta$) and X2(t)=½ cos($\omega c$ t+$\phi$−$\theta$) where $\theta$=cos$^{-1}$ (S(t)). In this example, $\phi$ contains the phase information of the original signal S(t), $\theta$ contains the amplitude information for the original signal S(t). After amplification, a reconstruction 338 or inverse transformation is performed on the amplified transformed signals X1(t) and X2(t) to produce the original signal S. In this embodiment, the reconstruction of the amplified transformed signals X1(t) and X2(t) is performed at RF prior to transmission using a variable combiner as the reconstruction block 338 which can combine signals of varying power ratio. One implementation of the variable combiner 338 includes a 180 degree hybrid coupler 340 which receives the amplified transformed signals and produces signals S1=cos $\theta$ sin $\omega t$ and S2=sin $\theta$ cos $\omega t$. A coupler 341, such as a 90 degree hybrid coupler combines phase shifted versions of S1 and S2. The combined, phase shifted signals are phase shifted by phase shifter 342 by an amount which is a function of $\theta$ to efficiently combine the signals from the coupler 341 to complete the inverse transformation by a coupler 344 in a manner which enables what can be termed as lossless combining of the amplified transformed signals to produce a version S' of the amplified signal.

In addition to the embodiment described above, alternative configurations of the amplification system and method according to the principles of the present invention are possible which omit and/or add components and/or use variations or portions of the described system. For example, FIG. 24 shows a signal amplification system 360 in which the original signal S(t) (or signals $S_i$(t)) is transformed by block 362 into a transformed signal X(t) which retains the amplitude and phase information of the original signal S(t) (or signals $S_i$(t)) by amplitude and/or angle modulating the original signal(s) with themselves while, for example spreading the energy of the original signal(s) in time and/or providing a transformed signal having a reduced PAR compared to the original signal(s). The transformation 362 can be a filter, for example including a notch, bandstop and/or bandpass filter(s), or a correlative filter bank, such as a, notch, bandstop or bandpass bank. In this embodiment, the transformation 362 can produce the transformed signal X(t)=V(t)cos($\omega c$ t+$\phi$)−V(t−d)sin($\omega c$ t+$\phi_d$) or V(t)cos($\omega c$ t+$\phi$)+V(t−d)sin(($\omega c$ t+$\phi_d$) where $\phi_d$ is the phase information of the time delayed version of the original signal. The transformed signal X is amplified by an amplifier 364 and can be inversely transformed at block 366, for example using an inverse filter, such as a single pole or pole filter, or an inverse correlative filter bank, such as a single pole or inverse filter bank, to recover the original signal S(t). The inverse transformation 366 occurs after amplification at radio frequency (RF) to reconstruct the original signal S(t). Depending on the embodiment, the transformation can occur at baseband, intermediate frequency (IF) or radio frequency (RF), and the inverse transformation can occur at RF or at a receiver.

FIG. 25 shows a particular implementation for a transformation 370 in which a circulator 372 receives the original signal S(t), and the circulator 372 provides the signal S(t) to a notch filter 374 which transforms the signal S(t) to produce a transformed signal S(t) by reducing a portion of the spectrum. A reflected portion of the spectrum is reflected back to the circulator 370 which produces the transformed signal X2 which reflects a reduction in the portion of the spectrum passed by the notch filter 374 and while maintaining the portion of the spectrum rejected by the notch 374. An inverse transformation can be performed to reconstruct a version of the original signal.

Depending on the embodiment, the transformations can be implemented in any of the manners described above along with any of the reconstructions described above. Accordingly, a variety of different components or methods cal be used to transform the original signal along with a variety of components or methods to reconstruct the transformed signals which are not necessarily the same combinations or implementations of transformations and reconstructions described together above.

Figure 26:
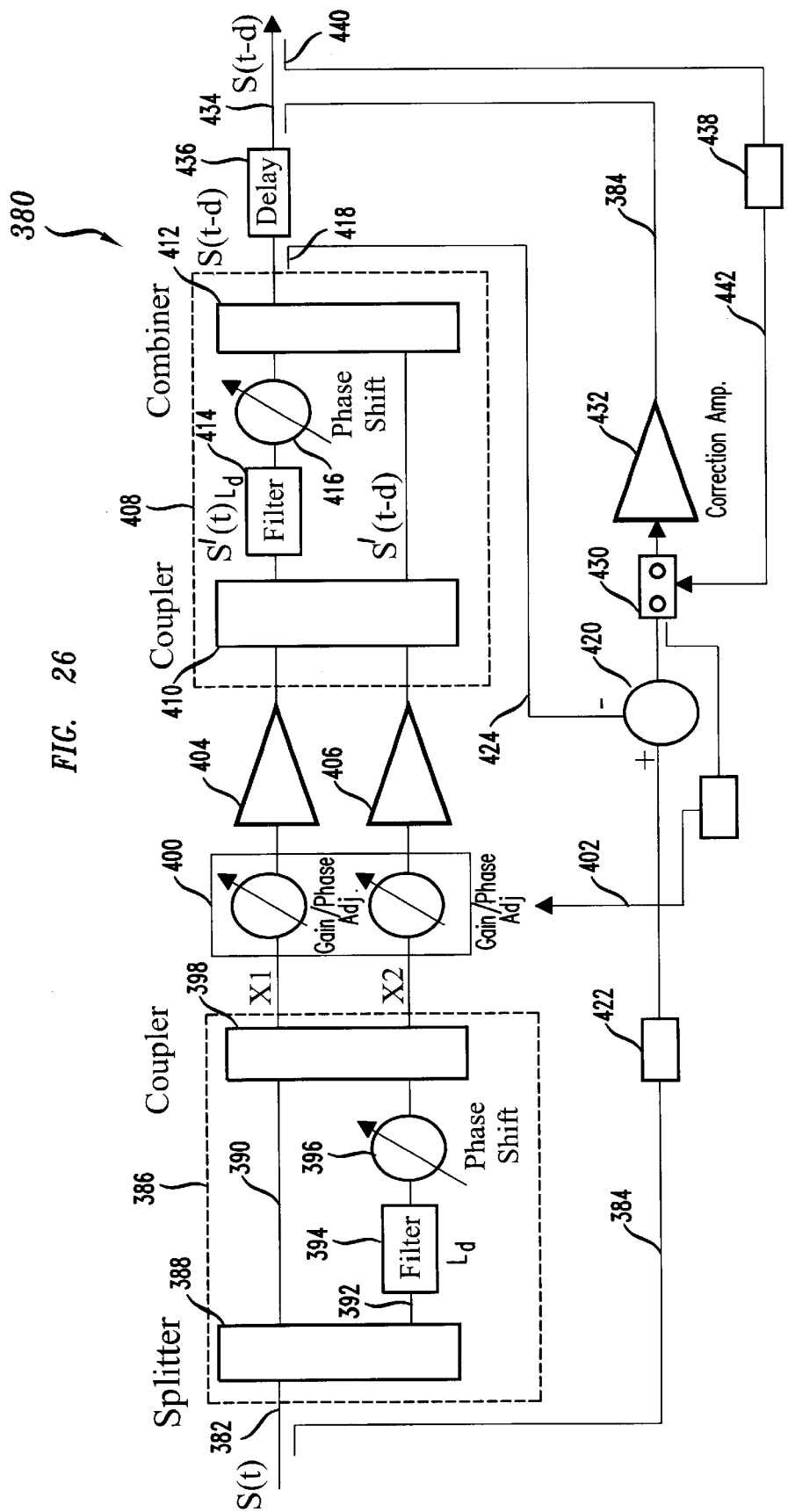
FIG. 26 shows an embodiment of the amplification system according to principles of the present invention being used in a feed forward distortion reduction system.

Additionally, the embodiments of the amplification system and method have been described as a method or system for amplifying a signal in a power efficient and/or linear fashion. The amplification system can be used along with other amplifier architectures or arrangements to provide improved linear and/or power efficient operation. For example, FIG. 26 shows how an embodiment of the amplification system according to the principles of the present invention can be used in a feed forward distortion reduction system 380. The signal to be amplified S(t) is replicated on a main signal path 382 and a feed forward path 384. On the main signal path 382, the signal S(t) is received by a transformation block 386 to spread the energy of the signal S(t) in time to produce the transformed signals X1 and X2. In this embodiment, the transformation 386 includes a splitter 388 which provides copies of the signal S(t) on a first amplifier path 390 and a second amplifier path 392. The signal on the second amplifier path 392 is delayed by a filter 394 and phase shifted by a phase shifter 396 relative to the signal on the first amplifier path 390. A coupler 398, such as a 3 dB hybrid coupler, receives the signal on the first path 390 and the delayed, phase shifted signal on the second path 392 and combines the signals to produce intermediate or transformed signals X1 and X2.

The transformed signals X1 and X2 are applied to gain & phase circuitry 400. The gain & phase circuit 400 adjusts the phase and gain of the transformed signals X1 and X2 relative to the signal S(t) on the feed forward path 384 based on control signal 402. An amplifier 404 amplifies the transformed signal X1, and the amplifier 406 amplifies the transformed signal X2. The amplified transformed signals X1 and X2 are provided to an inverse transformation or reconstruction 408 to de-spread the energy of the amplified transformed signals to reconstruct a version of the original signal S(t–d). In this embodiment, the reconstruction 408 includes a coupler 410, such as a 3 dB hybrid coupler, which receives the amplified transformed signals from the amplifiers 404 and 406. The coupler 410 shifts and combines the amplified transformed signals to produce a delayed amplified version S'(t–d) of the original signal S(t) and an amplified version S'(t) of the original signal S(t). The amplified delayed version S'(t–d) is fed to a combiner 412. The amplified version S'(t) is delayed or shaped by a filter 414, for example by an amount or inverse shape corresponding to the filter 394, to produce a delayed amplified version S'(t–d). A phase shifter 416 can shift the phase of the delayed amplified version S'(t–d) from the delay 394 to adjust the relative phase between the combining signals. The combiner 412 receives the amplified delayed version S'(t–d) and the delayed amplified version S'(t–d) from the phase shifter 416 and combines the signals to produce the amplified version S'(t–d) of the original signal.

A portion of the amplified version S'(t–d) of the original signal is obtained from a coupler 418 and is combined at a combiner 420 with a delayed version of the signal S(t) on the feed forward path 384 to isolate distortion on the feed forward path 384. The input signal on the feed forward path 384 is sufficiently delayed by delay circuit 422 so that such signal experiences the same delay as the signal appearing at the coupler 420 via path 424. In this embodiment, the gain & phase circuit 400 is controlled via the control path 402 with control signals to adjust the gain and/or phase of the transformed signals such that the signal S(t) appearing at the coupler 28 via the path 30 is substantially the inverse (equal in amplitude but 180° out of phase) of the delayed signal S(t) at the coupler 420. Alternatively, the gain and phase of the signal S(t) can be adjusted prior to the splitter 388. The control signal(s) appearing on the control path 402 of the gain & phase circuit 400 is derived from the signal at the output of the coupler 420 using a detection circuit 426 as would be understood by one of skill in the art.

The distortion (which can include a pilot signal) at the output of the coupler 420 is fed to gain & phase circuit 430 whose output is fed to amplifier 432 whose output is applied to a coupler 434. The signal produced by the inverse transformation or reconstruction 408 is fed to a delay circuit 436 whose output is fed to the coupler 434. The delay circuit 436 is designed such that amplified signal S(t–d) from the reconstruction 408 applied to the coupler 434 experience substantially the same delay as the signals from the output of the amplifier 432 applied to the coupler 434 to substantially cancel the distortion from the amplified signal S(t–d). In general, detection circuitry 438 will receive a portion of the output of the coupler 434 from a coupler 440 to determine how well the distortion (or pilot signal) is being cancelled. In this embodiment, the detection circuitry 438 generates control signals onto path 442 to cause the gain & phase circuit 430 to modify the distortion on the feed forward path 384 such that the distortion at the output of the coupler 434 is substantially the inverse (equal in amplitude but 180° out of phase) of the distortion on the feed forward path 384 at the coupler 434. The corresponding distortion (and pilot signals if any) substantially cancel each other at the coupler 434 leaving the amplified signal S'(t–d) at the output of the system. Other transformations and reconstructions can be used in a feed forward arrangement to produce the same or different amplified versions of the signal S.

Figure 27:
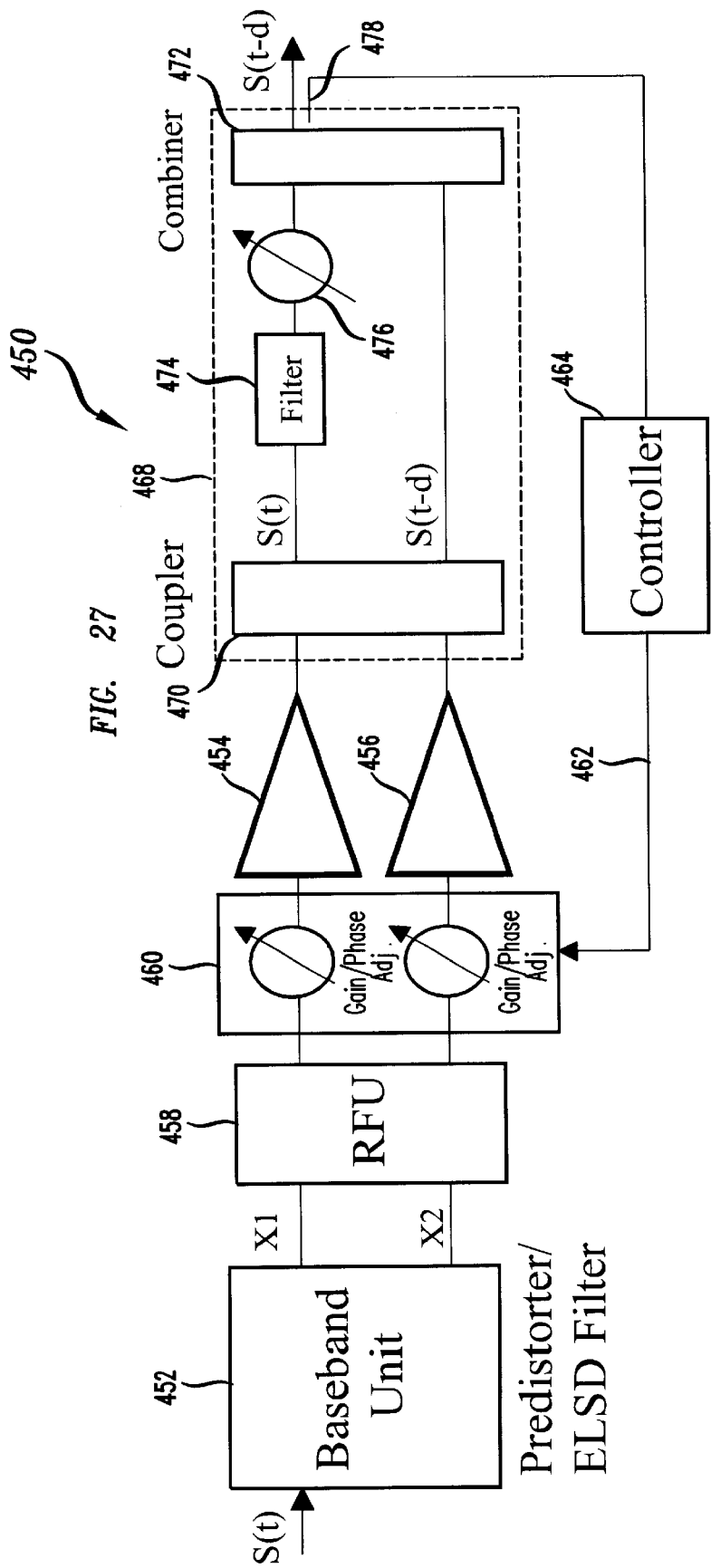
FIG. 27 shows an embodiment of the amplification system according to principles of the present invention being used in a pre-distortion system.

Furthermore, FIG. 27 shows how an embodiment of the amplification system according to the principles of the present invention can be used in a feed pre-distortion distortion reduction system 450. The signal to be amplified S(t) is shown at baseband in the digital domain being input into a baseband unit or processing circuitry 452. The processing circuitry 452 transforms the signal S(t) by spreading the energy of the transformed signal to produce transformed signals X1 and X2. Depending on the embodiment, the processing circuitry 452 can pre-distort the transformed signals individually based on the transfer function associated with each amplifier 454 and 456 or amplifier path. The transfer function can be defined as the function associated with the input vs. output of the respective amplifier 454 or 456. As such, given the transfer function for the downstream amplifiers 454 and 456, the processing circuitry 452 adjusts the respective amplitudes of the transformed signals to obtain linearly amplified transformed signals.

In this embodiment, the pre-distorted and transformed signals X1(t) and X2(t) are provided to a radio frequency unit (RFU) 458 which converts the transformed signals X1(t) and X2(t) to analog radio frequency (RF) from baseband (or an intermediate frequency if a previous conversion occurred). The transformed signals X1(t) and X2(t) are provided to gain and phase adjustment circuitry 460 prior to amplification. The gain & phase circuit 460 adjusts the phase and gain of the transformed signals X1 and X2 relative to each other based on control signal 462 from controller 464 to match differences in the amplifiers 454 and 456. The amplifier 454 amplifies the transformed signal X1, and the amplifier 456 amplifies the transformed signal X2.

The amplified transformed signals X1 and X2 are provided to an inverse transformation or reconstruction 468 to de-spread the energy of the amplified transformed signals to reconstruct a version of the original signal S(t–d). In this embodiment, the reconstruction includes a coupler 470, such as a 3 dB hybrid coupler, which receives the amplified transformed signals from the amplifiers 454 and 456. The coupler 470 shifts and combines the amplified transformed signals to produce a delayed amplified version S'(t–d) of the original signal S(t) and an amplified version S'(t) of the original signal S(t). The amplified delayed version S'(t–d) is fed to a combiner 472. The amplified version S'(t) is delayed or shaped by a filter 474, for example by an amount or inverse shape corresponding to the transformation performed on the original signal S(t) in the processing circuitry 452 to produce a delayed amplified version S'(t–d) of the original signal S(t). A phase shifter 476 can shift the phase of the delayed amplified version S'(t–d) from the delay 474 to adjust the relative phase between the combining signals. The combiner 472 receives the amplified delayed version S'(t–d) and the delayed amplified version S'(t–d) from the phase shifter 476 and combines the signals to produce the amplified version S'(t–d) of the original signal.

A portion of the amplified version S'(t–d) of the original signal is obtained from a coupler 478 and provided to the controller 464. In this embodiment, the gain & phase circuit 460 is controlled via the control path 462 with control signals to adjust the gain and/or phase of the transformed signals such that the signal S(t) appearing at the coupler 478 has a reduced amount of distortion or reflects a relatively linear transfer function. The control signal(s) appearing on the control path 402 of the gain & phase circuit 400 is derived from the signal at the output of the coupler 478 using a detection circuit as would be understood by one of skill in the art. Other transformations and reconstructions can be used in a pre-distortion arrangement to produce the same or different amplified versions of the signal S. Thus, the amplification system can be used in conjunction with other distortion reduction or amplifier linearization techniques to provide improved efficiency and/or linear performance in providing a signal after amplification Additionally, the amplification system has been described as transforming and amplifying a signal S(t), but the amplification system can be used to amplify single, changing, modulated (for example, using phase shift keying (PSK), such as QPSK and frequency shift keying (FSK)), multiple combined signals, multiple signals and separate signals. For example, where a signal S(t) was transformed to produce transformed signals by combining offset or frequency shaped versions of the original signal, multiple signals Si(t) can be transformed by combining or averaging the multiple signals with or without delay, phase or any other offset. The amplification system has been described with certain delays, phase shifters, couplers, combiners, processing circuitry and/or filters, but other components and arrangements of components or filters with different responses are possible which perform the described or other transformations and/or reconstructions. For example, the system has been described as using couplers, but other devices, such as 3 dB splitters and other coupling, signal splitting or sampling devices, can be used as well as other combining devices, such as summers. Moreover, in the couplers or networks described herein the inputs can be depicted as being positioned to correspond to the position of the outputs, but the manner in which the described blocks operate varies and depends on the embodiment and the function described herein as would be understood by one of skill in the art.

Depending on the application, the gain and/or phase circuitry and/or shifters can be positioned in different locations and/or paths within the described embodiments. The amplification system has been further described as using different configurations of discrete components, but it should be understood that the various embodiments and portions thereof can be implemented using different arrangements of components and functions using application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing at least one signal, said method comprising;

splitting the signal to be amplified to produce first and second versions;

delaying the second version within a delay circuit to produce a time-delayed version of the first version;

combining the first version and time-delayed version within a combiner to produce a first transformed signal and second transformed signal having reduced peak-to-average power ratios; and amplifying said transformed signals to be later inversely transformed.

2. The method of claim 1 wherein said transforming further including:

transforming said at least one signal into at least one transformed signal using an invertible transformation of said at least one signal.

3. The method of claim 1 wherein said transforming further including:

transforming said at least one signal into transformed signals which are correlated.

4. The method of claim 1 wherein said transforming further including:

transforming said at least one signal into transformed signals by combining delayed versions of said at least one signal.

5. The method of claim 1 wherein said transforming further including:

producing said at least one transformed signal as an invertible function of said signal.

6. The method of claim 1 further including:

providing said at least one amplified transformed signal for transmission.

7. The method of claim 6 further including:

performing an inverse transformation of said at least one amplified transformed signals at a receiver to produce a version of said at least one signal.

8. The method of claim 1 further including:

performing an inverse transformation on said at least one amplified transformed signal to produce an amplified signal.

9. The method of claim 8 further including:

providing said at least one amplified transformed signal for transmission.

10. The method of claim 8 wherein said performing including:
de-spreading the energy of said at least one amplified transformed signal in time.

11. A method of producing at least one signal, said method comprising:
splitting the signal to be amplified to produce first and second versions;
delaying the second version within a delay circuit to produce a time-delayed version of the first version;
combining the first version and time-delayed version within a combiner to produce at least one transformed signal having a reduced peak-to-average ratio; and
amplifying said at least one transformed signal to be later inversely transformed.

12. The method of claim 11 wherein said transforming further including:
transforming said at least one signal into at least one transformed signal by combining versions of said at least one signal.

13. The method of claim 12 wherein said transforming further including:
transforming said at least one signal into at least one transformed signal by combining versions of said at least one signal which are offset.

14. The method of claim 12 wherein said transforming further including:
transforming said at least one signal into at least one transformed signal by combining versions of said at least one signal which are offset in time.

15. The method of claim 12 wherein said transforming further including:
transforming said at least one signal into at least one transformed signal by combining versions of said at least one signal which are offset in phase.

16. The method of claim 12 wherein said transforming further including:
transforming said at least one signal into at least one transformed signal by combining versions of said at least one signal which are offset in frequency.

17. The method of claim 11 wherein said transforming further including:
transforming signals into at least one transformed signal by combining different of said signals.

18. The method of claim 11 further including:
providing said at least one amplified transformed signal or a processed version thereof for transmission.

19. The method of claim 11 further including:
performing at least a portion of an inverse transformation of said at least one amplified transformed signals or a processed version thereof at a receiver to produce a version of said signal.

20. The method of claim 11 further including:
performing an inverse transformation on said at least one amplified transformed signal to produce an amplified signal.

21. A method of producing a signal, said method comprising:
splitting the signal to be amplified to produce first and second versions;
delaying the second version within a delay circuit to produce a time-delayed version of the first version;
combining the first version and time-delayed version within a combiner to produce at least one transformed signal having a reduced peak-to-average ratio;
amplifying said at least one transformed signal into at least one amplified transformed signal; and
constructing at least one amplified signal from said at least one amplified transformed signal by inverse transformation.

22. The method of claim 21 wherein said transforming comprises:
transforming said at least one signal to be amplified into at least one transformed signal which is an invertible function of said at least one signal.

23. A method of producing versions of a signal, said method comprising:
transforming a signal to be amplified into transformed signals by splitting the signal to be amplified to produce first and second versions;
delaying the second version within a delay circuit to produce a time-delayed version of the first version;
combining the first version and time-delayed version within a combiner to produce a first transformed signal and second transformed signal having reduced peak-to-average power ratios;
amplifying said transformed signals into amplified transformed signals; and
processing said amplified transformed signals to produce versions of said signal having a relative delay for transmission on separate antennas.

24. A method of producing signals on separate antennas, said method comprising:
transforming at least one signal to be amplified into transformed signals by splitting the signal to be amplified to produce first and second versions;
delaying the second version within a delay circuit to produce a time-delayed version of the first version;
combining the first version and time-delayed version within a combiner to produce a first transformed signal and second transformed signal having reduced peak-to-average power ratios;
amplifying said transformed signals into amplified transformed signals; and
providing said amplified transformed signals for transmission so said amplified transformed signals or processed versions thereof are transmitted on separate antennas.

25. An apparatus for producing a signal comprising:
a splitter for receiving a signal and splitting the signal into first and second versions on first and second paths;
a delay circuit positioned on the second path for delaying the second version to produce a delayed in time version;
a combiner for receiving the first version and second delayed in time version and producing at least one transformed signal having a reduced peak-to-average power ratio; and
an amplifier circuit for receiving and amplifying the at least one transformed signal to be later inversely transformed.

26. An apparatus according to claim 25, wherein said amplifier circuit further comprises first and second amplifiers for receiving transformed signals.

27. An apparatus according to claim 25, and further comprising an inverse combiner circuit for reconstructing an original signal from the transformed signals after having been amplified.

28. An apparatus according to claim 25, wherein said inverse combiner circuit further comprises a delay circuit.

* * * * *